(12) United States Patent
Nakajima et al.

(10) Patent No.: US 10,557,945 B2
(45) Date of Patent: Feb. 11, 2020

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventors: Katsuhito Nakajima, Minowa-machi (JP); Kentaro Seo, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 347 days.

(21) Appl. No.: 15/489,143

(22) Filed: Apr. 17, 2017

(65) Prior Publication Data

US 2017/0307762 A1    Oct. 26, 2017

(30) Foreign Application Priority Data

Apr. 25, 2016 (JP) ................. 2016-086657

(51) Int. Cl.
| | | |
|---|---|---|
| *G01S 19/23* | (2010.01) | |
| *H03L 7/107* | (2006.01) | |
| *H03L 1/02* | (2006.01) | |
| *H03L 7/085* | (2006.01) | |
| *H03L 1/04* | (2006.01) | |
| *H03L 7/093* | (2006.01) | |
| *H03L 7/095* | (2006.01) | |
| *H03L 7/099* | (2006.01) | |

(52) U.S. Cl.
CPC ............ *G01S 19/235* (2013.01); *H03L 1/022* (2013.01); *H03L 1/028* (2013.01); *H03L 7/085* (2013.01); *H03L 7/1075* (2013.01); *H03L 1/04* (2013.01); *H03L 7/093* (2013.01); *H03L 7/095* (2013.01); *H03L 7/099* (2013.01)

(58) Field of Classification Search
CPC ....... G01S 19/235; H03L 1/022; H03L 1/028; H03L 1/04; H03L 7/085; H03L 7/075; H03L 7/095; H03L 7/099; H03L 7/093
USPC ............. 342/357.62; 327/147, 150, 156, 159
See application file for complete search history.

(56) References Cited

U.S. PATENT DOCUMENTS 4,305,045 A    12/1981  Metz et al.
5,576,664 A    11/1996  Herold et al.
(Continued)

FOREIGN PATENT DOCUMENTS

| JP | H08056153 A | 2/1996 |
|---|---|---|
| JP | 2009268047 A | 11/2009 |
| JP | 2015115933 A | 6/2015 |

OTHER PUBLICATIONS

May 10, 2018 Office Action issued in U.S. Appl. No. 15/492,573.

*Primary Examiner* — Chuong P Nguyen
(74) *Attorney, Agent, or Firm* — Oliff PLC

(57) ABSTRACT

A circuit device includes a phase comparator that performs phase comparison between an input signal based on an oscillation signal and a reference signal, a processor that performs a signal process, and an oscillation signal generation circuit that generates the oscillation signal having an oscillation frequency which is set on the basis of frequency control data from the processor. The circuit device also includes at least one of a first register that stores phase comparison result data, a second register in which one of offset adjustment data for GPS and offset adjustment data for UTC is set, and a third register in which offset adjustment data for adjusting a phase difference is set.

23 Claims, 19 Drawing Sheets

(56) References Cited

U.S. PATENT DOCUMENTS

| | | | | |
|---|---|---|---|---|
| 5,757,786 | A * | 5/1998 | Joo | H04J 3/0685 |
| | | | | 370/324 |
| 7,397,312 | B2 * | 7/2008 | Guilford | H03J 7/065 |
| | | | | 331/11 |
| 7,424,069 | B1 | 9/2008 | Nicholls et al. | |
| 7,932,856 | B2 * | 4/2011 | Baba | G01S 19/19 |
| | | | | 342/357.25 |
| 8,705,509 | B2 * | 4/2014 | Kuwabara | H04W 56/0015 |
| | | | | 370/252 |
| 8,875,577 | B2 * | 11/2014 | Uemura | G01C 19/5614 |
| | | | | 73/514.01 |
| 9,628,096 | B2 * | 4/2017 | Toriumi | H03L 7/1976 |
| 10,171,094 | B2 * | 1/2019 | Nakajima | H03L 1/022 |
| 10,298,242 | B2 * | 5/2019 | Miyahara | H03L 7/093 |
| 2007/0026830 | A1 * | 2/2007 | Guilford | G01R 23/173 |
| | | | | 455/260 |
| 2009/0267664 | A1 | 10/2009 | Uozumi et al. | |
| 2014/0361812 | A1 * | 12/2014 | Yamashina | H03K 4/026 |
| | | | | 327/107 |
| 2014/0361841 | A1 * | 12/2014 | Sawada | H03L 7/16 |
| | | | | 331/18 |
| 2015/0102860 | A1 * | 4/2015 | Toriumi | H03L 7/197 |
| | | | | 331/34 |
| 2017/0194907 | A1 | 7/2017 | Yonezawa | |
| 2017/0194966 | A1 | 7/2017 | Yonezawa | |
| 2017/0194967 | A1 | 7/2017 | Yonezawa | |
| 2017/0194968 | A1 | 7/2017 | Yonezawa | |
| 2017/0307762 | A1 | 10/2017 | Nakajima et al. | |
| 2017/0310326 | A1 | 10/2017 | Nakajima | |
| 2018/0091156 | A1 | 3/2018 | Maki et al. | |

* cited by examiner

CIRCUIT DEVICE, OSCILLATOR, ELECTRONIC APPARATUS, AND VEHICLE

CROSS-REFERENCE TO RELATED APPLICATIONS

The present application claims priority to Japanese Patent Application JP 2016-086657, filed Apr. 25, 2016, the entire disclosure of which is hereby incorporated by reference herein.

BACKGROUND

1. Technical Field

Various embodiments of the present invention relates to a circuit device, an oscillator, an electronic apparatus, and a vehicle.

2. Related Art

In the related art, there is an oscillator such as an oven controlled crystal oscillator (OCXO) or a temperature compensated crystal oscillator (TCXO). For example, in a base station, a network router, a measurement apparatus, and the like using such an oscillator as a reference signal source, a phase locked loop (PLL) circuit including the oscillator is configured, and an oscillation signal of the oscillator is synchronized with a reference signal such as a GPS signal.

The related art of the PLL circuit is disclosed in, for example, JP-A-2009-268047. In JP-A-2009-268047, a phase comparator outputs a phase difference pulse corresponding to a phase difference between a reference signal and a feedback signal, a time to digital converter (TDC) converts the phase difference pulse into a digital value, and a digitally controlled oscillator (DCO) is caused to oscillate on the basis of the digital value. In this configuration, in a case where a slew rate of a circuit in the previous state generating a phase difference pulse is low, a thin phase difference pulse corresponding to a minute phase difference close to zero may not be transmitted to the TDC. In JP-A-2009-268047, an offset value is added to any one of positions in a loop so that a reference signal and a feedback signal having a phase difference which is not zero are input to the TDC even during locking, and thus a phase difference pulse can be reliably transmitted thereto.

There is a case where a phase difference pulse is desired to be able to be transmitted even if a slew rate of a circuit in the previous stage generating a phase difference pulse is low as in JP-A-2009-268047, and a phase difference between a reference signal and an oscillation signal is also wanted to be a desired value. Alternatively, there is a case where an operation test using offset adjustment is desired to be performed. Specifically, an operation of a PLL circuit may be desired to be tested by inputting test data as offset adjustment data.

SUMMARY

An advantage of some aspects of the invention is to provide a circuit device, an oscillator, an electronic apparatus, and a vehicle, capable of setting a phase difference between a reference signal and an oscillation signal to a desired value or capable of performing an operation test using offset adjustment.

The various embodiments of the invention can be implemented as the following forms or configurations.

An aspect of the invention relates to a circuit device including a phase comparator that performs phase comparison between an input signal based on an oscillation signal and a reference signal; a processor that performs a signal process on frequency control data based on a result of the phase comparison; an oscillation signal generation circuit that generates the oscillation signal having an oscillation frequency which is set on the basis of frequency control data having undergone the signal process from the processor; and a register circuit. Offset adjustment is performed on phase comparison result data obtained after the phase comparison is performed. The register circuit includes at least one of a first register that stores the phase comparison result data as monitor data, a second register in which first offset adjustment data which is one of offset adjustment data for global positioning system (GPS) and offset adjustment data for Coordinated Universal Time (UTC) is set, and a third register in which second offset adjustment data for adjusting a phase difference between the reference signal and the oscillation signal is set.

With this configuration, one of offset adjustment data for GPS and offset adjustment data for UTC is set in the second register, and thus a phase difference between the reference signal and the oscillation signal can be set to a desired value corresponding to the type of reference signal. Offset adjustment data for adjusting a phase difference between the reference signal and the oscillation signal is set in the third register, and thus a phase difference between the reference signal and the oscillation signal can be set to any desired value. The first register stores phase comparison result data as the monitor data, and thus the monitor data can be output to an external device. Consequently, it is possible to test an operation of a PLL circuit.

In the aspect of the invention, the circuit device may further include a terminal that is connectable to a resonator used to generate the oscillation signal, and the oscillation signal may be a signal output from the terminal.

For example, there is a probability that a phase difference may occur between the oscillation signal output from the terminal of the circuit device and the reference signal due to delay or the like in a feedback path to the phase comparator from the oscillation signal generation circuit. In relation to this fact, according to the aspect of the invention, it is possible to adjust the phase difference by using offset adjustment data set in the third register.

In the aspect of the invention, in a test mode, test data for simulating the phase comparison result data may be input as offset adjustment data, and phase comparison result data obtained after the phase comparator performs phase comparison may be stored in the first register as the monitor data.

With this configuration, if test data for simulating phase comparison result data is input instead of offset adjustment data, phase comparison result data in this case can be monitored. For example, an external device such as a test device can test an operation of a PLL circuit by monitoring phase comparison result data.

In the aspect of the invention, the processor may perform the offset adjustment on the phase comparison result data on the basis of at least one of the first offset adjustment data and the second offset adjustment data, and generate the frequency control data on the basis of the phase comparison result data having undergone the offset adjustment.

As mentioned above, the processor performs offset adjustment on phase comparison result data on the basis of offset adjustment data, and thus a phase difference corresponding to the offset adjustment data is added between the oscillation signal based on the frequency control data generated by the processor and the reference signal. In the above-described way, a phase difference is adjusted by using the offset adjustment data.

In the aspect of the invention, offset adjustment data for GPS and offset adjustment data for UTC which are different from each other may be set in the second register as the first offset adjustment data.

There is a time difference between a GPS time pulse and a UTC time pulse. According to the present embodiment, offset adjustment data for GPS and offset adjustment data for UTC which are different from each other are set, and thus a phase difference corresponding to the time difference can be intentionally added to the oscillation signal. Consequently, it is possible to perform accurate time synchronization even in a case where either of the GPS time pulse and the UTC time pulse is used as the reference signal.

In the aspect of the invention, the offset adjustment data for GPS may be offset adjustment data for adjusting a phase difference between the reference signal and the input signal to a predetermined value for GPS, and the offset adjustment data for UTC may be offset adjustment data for adjusting a phase difference between the reference signal and the input signal to a predetermined value for UTC.

As mentioned above, if offset adjustment data for GPS corresponding to a predetermined value for GPS and offset adjustment data for UTC corresponding to a predetermined value for UTC are set, it is possible to perform accurate time synchronization even in a case where either of a GPS time pulse and a UTC time pulse is used as the reference signal.

In the aspect of the invention, the phase comparator may include a counter that performs a count operation by using the input signal, and perform the phase comparison by comparing a count value in the counter in n (where n is an integer of 1 or more) cycles of the reference signal with an expected value of the count value in integers.

According to the aspect of the invention, the phase comparator performs phase comparison of comparing a count value in the counter with an expected value in integers, and thus the phase comparator can be formed with a simple configuration. Consequently, it is possible to miniaturize the circuit device. According to the aspect of the invention, the phase comparator compares a count value in the counter in n cycles of the reference signal with the expected value of the count value in integers. In addition, n can be set to 2 or more. Consequently, the time resolution of a phase error detected by the phase comparator can be reduced. In other words, it is possible to reduce a phase error in a lock state of a PLL circuit including the phase comparator.

In the aspect of the invention, the processor may perform the signal process including at least one of a temperature compensation process, an aging correction process, and a process of correcting capacitance characteristics of a variable capacitance capacitor connected to a resonator used to generate the oscillation signal, and the offset adjustment.

As mentioned above, the processor performs offset adjustment, and thus a desired phase difference can be added to the oscillation signal with respect to the reference signal. The processor performs the temperature compensation process, the aging correction process, and the capacitance characteristic correction process along with the offset adjustment. For example, a plurality of processes can be performed by sharing hardware such as a DSP. Consequently, circuits of the processor can be scaled down compared with a case where each process is performed by individual hardware.

In the aspect of the invention, the processor may perform a digital filter process on phase error data which is a result of the phase comparison.

As mentioned above, the processor performs the digital filter process on the phase error data, and thus the processor can generate frequency control data on the basis of the phase error data.

In the aspect of the invention, the circuit device may further include a digital interface, and the oscillation signal generation circuit may generate the oscillation signal by using the frequency control data based on a result of the phase comparison in a first mode, and generate the oscillation signal by using the frequency control data based on externally generated frequency control data which is input via the digital interface in a second mode.

With this configuration, for example, a mode can be selected according to a use method desired by a user, and it is possible to perform switching between control of an oscillation frequency using an internal PLL and control of an oscillation frequency using an external PLL.

Another aspect of the invention relates to an oscillator including any one of the circuit devices; and a resonator that is used to generate the oscillation signal.

Another aspect of the invention relates to an electronic apparatus including anyone of the circuit devices.

Another aspect of the invention relates to a vehicle including any one of the circuit devices.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, an embodiment of the invention will be described in detail. The embodiment described below is not intended to improperly limit the scope or content of the appended claims, and all constituent elements described in the present embodiment are not essential as solving means of the various embodiments of the invention.

For example, in the following description, a description will be made of an exemplary case where a phase comparator of a count type performs phase comparison in an integer, but one or more embodiments of the invention may be applied to a PLL circuit using phase comparators (a phase comparator of a type of performing phase comparison in a decimal; for example, a type of using a TDC) other than the count type phase comparator.

1. Configuration

Figure 1:
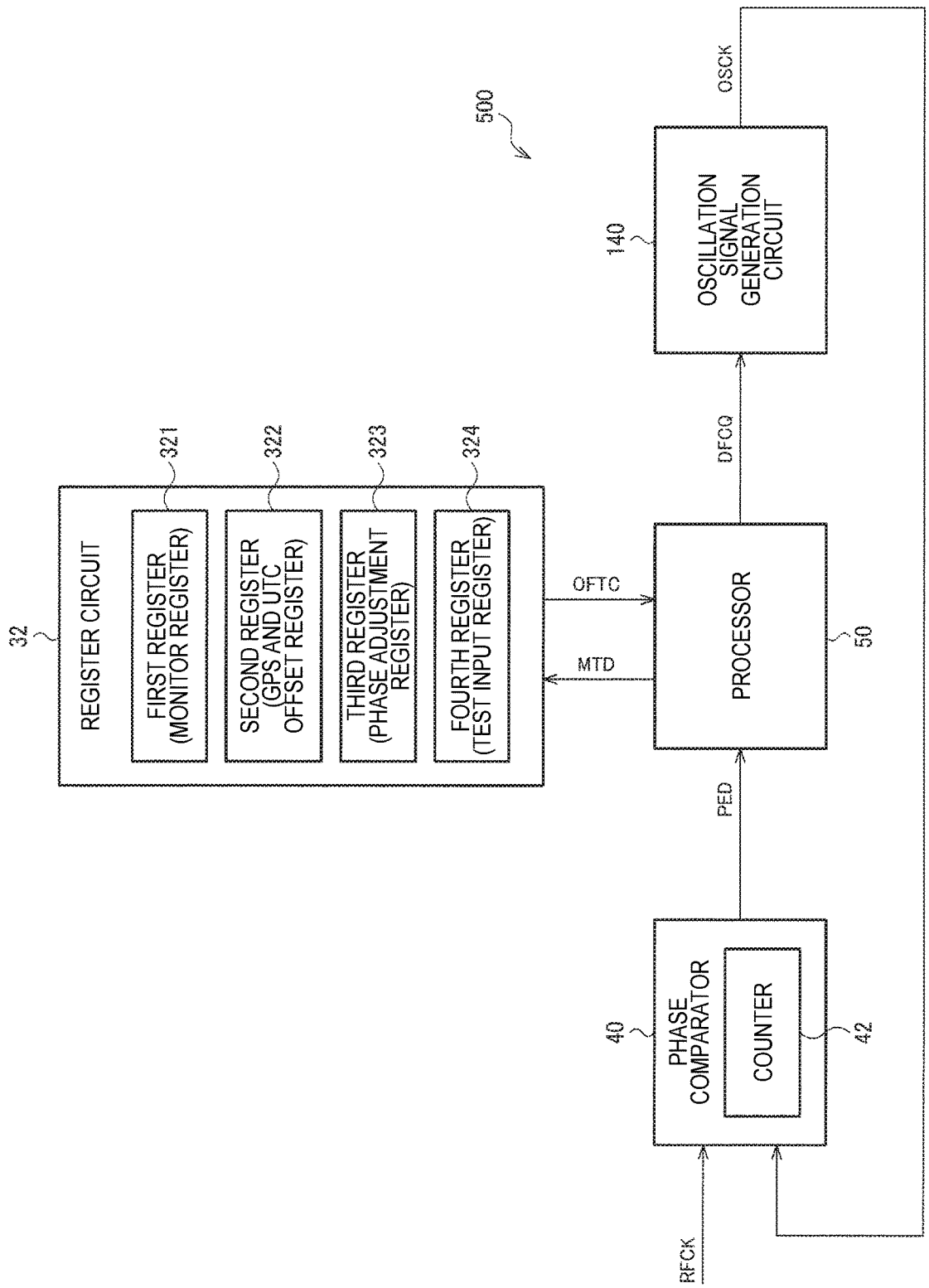
FIG. 1 is a diagram illustrating a configuration example of a circuit device according to an embodiment.

FIG. 1 is a diagram illustrating a configuration example of a circuit device 500 according to the present embodiment. The circuit device 500 includes a register circuit 32, a phase comparator 40 (phase comparison circuit), a processor 50 (processing circuit), and an oscillation signal generation circuit 140.

The phase comparator 40 compares a phase of an oscillation signal OSCK generated by the oscillation signal generation circuit 140 with a phase of a reference signal RFCK, and outputs a result thereof as phase error data PED. Specifically, the phase comparator 40 includes a counter 42 which counts the number of clocks of the oscillation signal OSCK, and outputs the phase error data PED on the basis of a count value in the counter 42. Here, the reference signal RFCK is a pulse signal which is input at a predetermined timing or at a predetermined interval, and is, for example, a signal used as a reference of time. For example, the reference signal RFCK is a reference signal (time pulse) output from a GPS receiver or a reference signal (clock signal) output from a physical layer circuit in a network.

Figure 2:
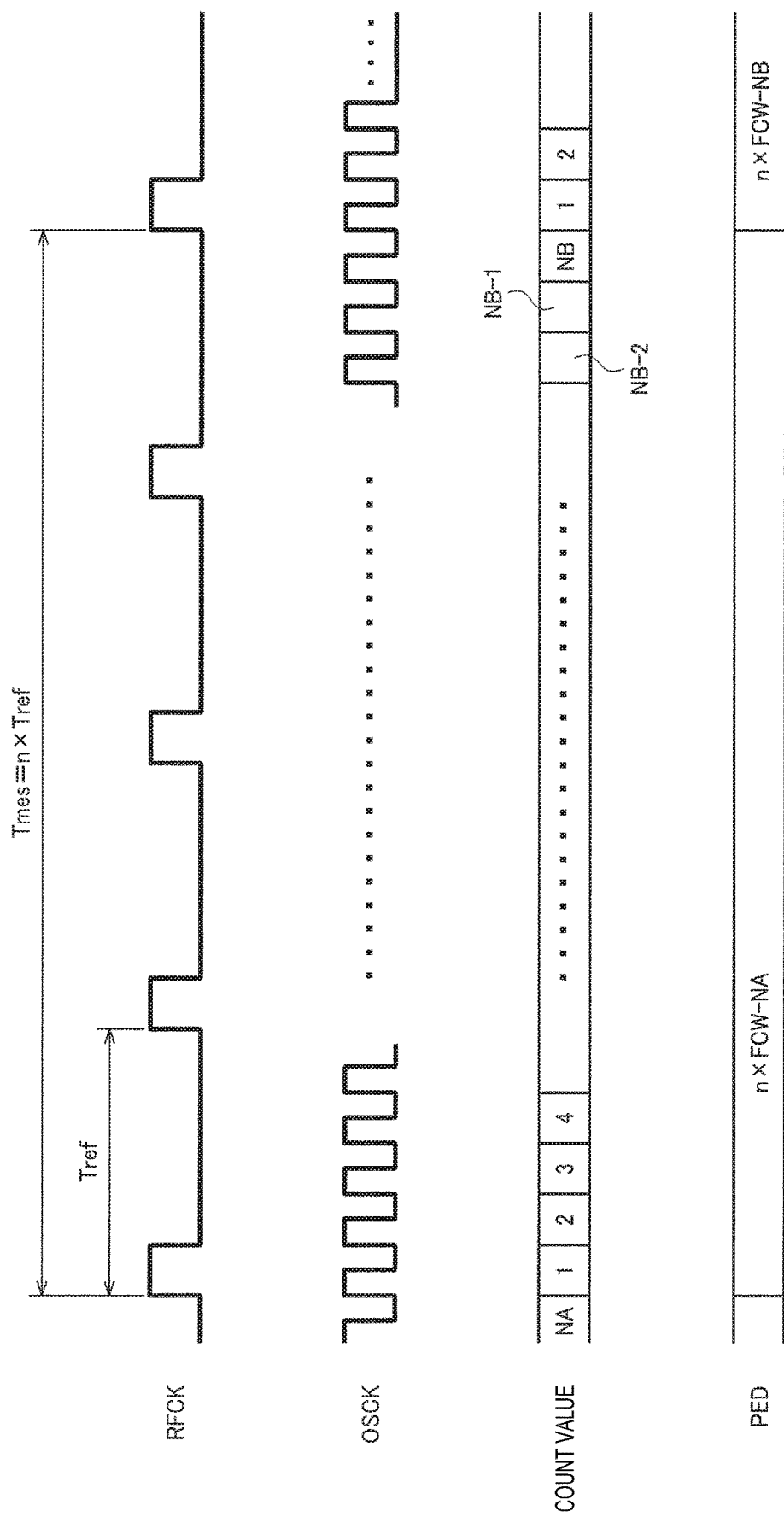
FIG. 2 is a timing chart for explaining an operation of a phase comparator.

FIG. 2 is a timing chart for explaining an operation of the phase comparator 40. As illustrated in FIG. 2, a cycle of the reference signal RFCK is indicated by Tref. For example, Tref is 1 second in a GPS reference signal. The counter 42 resets a count value thereof at, for example, a rising edge of the reference signal RFCK, and counts the number of clocks of the oscillation signal OSCK for a measurement time Tmes (measurement period) from the edge. The measurement time Tmes is a cycle for performing phase comparison, and corresponds to n cycles of the reference signal RFCK. In other words, phase errors accumulated for the measurement time Tmes are detected. As will be described later, n is an integer which can be set to 2 or more. In a case where a count value when the measurement time Tmes is finished is indicated by NB, a difference (n×FCW-NB) between an expected value n×FCW and the count value NB is output as the phase error data PED. FCW indicates frequency setting data for setting a frequency of the oscillation signal OSCK.

Here, an exemplary case where the counter 42 is counted up from an initial value of "0" has been described, but any other configuration may be used. For example, as will be described later, there may be a configuration in which countdown is performed with the expected value n×FCW as an initial value, and a count value when the measurement time Tmes is finished becomes (n×FCW-NB).

The processor 50 performs various digital signal processes. Specifically, the processor 50 performs a digital signal process on the phase error data PED from the phase comparator 40, and generates frequency control data DFCQ for controlling a frequency of the oscillation signal OSCK. For example, the processor 50 performs a process of converting the phase error data PED corresponding to a difference between a count value and the expected value n×FCW into phase error data having time as the unit, or a loop filter process (digital filter process) on phase error data. The processor 50 may perform an offset adjustment process (an offset adjustment process between the reference signal RFCK and the oscillation signal OSCK) on phase error data, or various correction processes and the like on frequency control data having undergone the loop filter process. The correction process is, for example, a process (temperature compensation process) of compensating for temperature dependency of an oscillation frequency of a resonator, or a process (capacitance characteristic correction process) of correcting capacitance characteristics of a variable capacitance capacitor (a varicap or the like) for controlling an oscillation frequency. Alternatively, the correction process may be a process (aging correction process) of correcting a change over time in an oscillation frequency in a state in which an oscillator performs self-running oscillation during hold-over. The processor 50 may be implemented by an ASIC circuit such as a gate array, and may be implemented by a processor (for example, a central processing unit (CPU) or a digital signal processor (DSP)) and a program (program module) operating on the processor.

The oscillation signal generation circuit 140 generates the oscillation signal OSCK having an oscillation frequency set on the basis of the frequency control data DFCQ. For example, the oscillation signal generation circuit 140 generates the oscillation signal OSCK having an oscillation frequency which is set on the basis of the frequency control data DFCQ by using the frequency control data DFCQ from the processor 50 and a resonator. As an example, the oscillation signal generation circuit 140 causes the resonator to oscillate with an oscillation frequency set on the basis of the frequency control data DFCQ, so as to generate the oscillation signal OSCK.

The oscillation signal generation circuit 140 may be a circuit which generates the oscillation signal OSCK according to a direct digital synthesizer method. For example, the oscillation signal OSCK having an oscillation frequency set on the basis of the frequency control data DFCQ may be digitally generated by using an oscillation signal from the resonator (an oscillation source with a fixed oscillation frequency) as a reference signal. Alternatively, the oscillation signal generation circuit 140 may be a circuit which generates the oscillation signal OSCK having an oscillation frequency which is set on the basis of the frequency control data DFCQ without using a resonator. For example, the oscillation signal generation circuit 140 may be formed of a D/A conversion circuit which converts the frequency control data DFCQ into a control voltage, or a voltage controlled oscillation circuit (VCO) which oscillates at an oscillation frequency set on the basis of the control voltage. Alternatively, the oscillation signal generation circuit 140 may be formed of a CR oscillation circuit including a variable capacitor whose capacitance is variably controlled according to the frequency control data DFCQ. The CR oscillation circuit oscillates at an oscillation frequency set on the basis of the capacitance of the variable capacitor.

A PLL circuit is formed of the phase comparator 40, the processor 50, the oscillation signal generation circuit 140, and thus the oscillation signal OSCK synchronized with the reference signal RFCK is generated. In other words, the processor 50 performs negative feedback control on the phase error data PED through proportional-integral (PI) control or the like, so as to generate the frequency control data DFCQ in which a phase error is reduced (close to zero). The oscillation signal generation circuit 140 generates the oscillation signal OSCK on the basis of the frequency control data DFCQ, and thus generates the oscillation signal OSCK synchronized with the reference signal RFCK.

The register circuit 32 includes a first register 321 (monitor register), a second register 322 (GPS and UTC offset register), a third register 323 (phase adjustment register), and a fourth register 324 (test input register). In some embodiments, the register circuit is embodied as or forms part of a data storage and retrieval system for a computer memory as discussed herein.

First, the second register 322 will be described. In a case where the reference signal RFCK is a time pulse which is input from a global positioning system (GPS) receiver, GPS offset adjustment data is stored in the second register 322. In a case where the reference signal RFCK is a time pulse based on Coordinated Universal Time (UTC), which is input from a network, UTC offset adjustment data is stored in the second register 322. The processor 50 performs a process of adding the offset adjustment data stored in the second register 322 to phase comparison result data (for example, QPE in FIG. 4). Consequently, a phase difference (offset) corresponding to GPS or UTC offset adjustment data is added between the reference signal RFCK and the oscillation signal OSCK.

There is a predetermined time difference (for example, 20 nanoseconds) between a GPS time pulse and a UTC time pulse. Thus, a time error corresponding to the time difference occurs between an oscillator synchronized with the GPS time pulse and an oscillator synchronized with the UTC time pulse. In the present embodiment, since a phase difference between the reference signal RFCK and the oscillation signal OSCK can be adjusted depending on the type of reference signal RFCK, it is possible to perform highly accurate time synchronization among a plurality of oscillators. For example, the GPS offset adjustment data is offset adjustment data corresponding to zero phase difference, and the UTC offset adjustment data is offset adjustment data corresponding to the predetermined time difference.

The third register 323 stores offset adjustment data for adjusting a phase difference between the reference signal RFCK and the oscillation signal OSCK. The processor 50 performs a process of adding the offset adjustment data stored in the third register 323 to phase comparison result data. Thus, any phase difference (offset) can be added between the reference signal RFCK and the oscillation signal OSCK.

There is a probability that a phase of the oscillation signal OSCK reaching an input node of the phase comparator 40 may be different from a phase of the oscillation signal OSCK output from the oscillation signal generation circuit 140. For example, a phase changes due to delay caused as a result of the signal passing through a buffer circuit, or due to delay caused by parasitic capacitance and parasitic resistance of a signal line. Thus, even a phase difference between the oscillation signal OSCK and the reference signal RFCK reaching the input node of the phase comparator 40 is zero, a phase difference may occur between the oscillation signal OSCK output from the oscillation signal generation circuit 140 and the reference signal RFCK. In the present embodiment, a phase difference between the reference signal RFCK and the oscillation signal OSCK can be arbitrarily adjusted, and thus such a phase difference can be finely adjusted.

The fourth register 324 stores test data for simulating phase comparison result data. The processor 50 performs a signal process on the test data stored in the fourth register 324 instead of phase comparison result data. Consequently, the phase error data PED obtained in a case where the PLL circuit is operated by using the test data as phase comparison result data is output from the phase comparator 40. The first register 321 stores phase comparison result data from the processor 50 as monitor data MTD. The first register 321 may store the phase error data PED from the phase comparator 40 as the monitor data MTD. The third register 323 may also be used as the fourth register 324, so as to store test data during a test mode. In this case, the fourth register 324 is omitted.

For example, an operation test of the PLL circuit may be performed as one of test items in test or the like before shipment of the circuit device 500. In the present embodiment, test data for simulating phase comparison result data can be input, and it is possible to test whether or not the expected phase error data PED can be obtained with respect to the test data.

The phase comparison result data is data obtained after the phase comparator 40 performs phase comparison. The phase comparison result data may be data generated in a loop after phase comparison is performed. For example, the phase comparison result data is data obtained by performing predetermined processes (for example, a conversion process, a multiplication process, an addition process, and a filter process) on the phase error data PED output from the phase comparator 40. Alternatively, the phase comparison result data may be the phase error data PED output from the phase comparator 40. The second register 322, the third register 323, and the fourth register 324 may store offset adjustment data obtained by converting a phase difference between the reference signal RFCK and the oscillation signal OSCK into phase comparison result data corresponding thereto.

Offset adjustment data OFTC which is input to the processor 50 from the register circuit 32 is at least one of the offset adjustment data items stored in the second register 322, the third register 323, and the fourth register 324. For example, the offset adjustment data OFTC is any one of three register values. Alternatively, a plurality of register values may be input to the processor 50 as the offset adjustment data OFTC, and the plurality of register values may be added to phase comparison result data.

Figure 8:
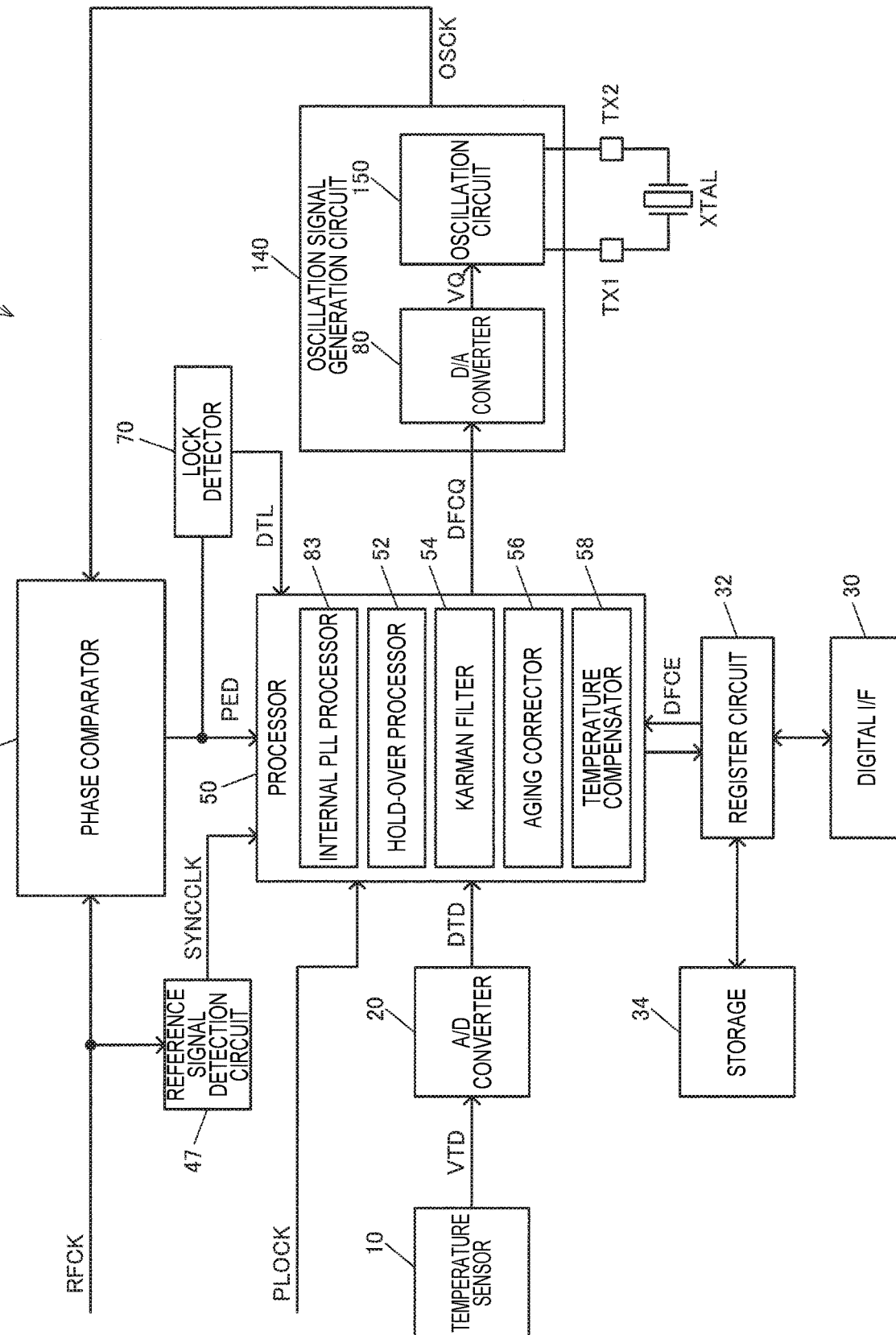
FIG. 8 is a third detailed configuration example of the circuit device according to the embodiment.

An external device (for example, a CPU or a test device) writes data into the second register 322, the third register 323, and the fourth register 324 via, for example, a digital interface 30 illustrated in FIG. 8. Alternatively, data may be stored in a storage 34 or the like illustrated in FIG. 8, and the data may be read to the second register 322, the third register 323, and the fourth register 324. The first register 321 can be accessed from the external device via, for example, the digital interface 30 illustrated in FIG. 8, and the phase error data PED is read by the external device.

In the above-described embodiment, the circuit device 500 includes the phase comparator 40 which compares phases of an input signal based on the oscillation signal OSCK and the reference signal RFCK with each other; the processor 50 which performs a signal process on frequency control data based on a phase comparison result; the oscillation signal generation circuit 140 which generates the oscillation signal OSCK having an oscillation frequency set on the basis of the frequency control data DFCQ having undergone the signal process from the processor 50; and the register circuit 32. Offset adjustment is performed on phase comparison result data obtained after the phase comparison is performed. The register circuit 32 includes at least one of the first register 321 which stores phase comparison result data as the monitor data MTD, the second register 322 in which first offset adjustment data which is one of GPS offset adjustment data or UTC offset adjustment data is set, and the third register 323 in which second offset adjustment data for adjusting a phase difference between the reference signal RFCK and the oscillation signal OSCK is set.

In the above-described way, a phase difference between the reference signal RFCK and the oscillation signal OSCK can be set to a desired value. It is possible to perform an operation test using offset adjustment. Specifically, either one of GPS offset adjustment data and UTC offset adjustment data is set in the second register 322, and thus a phase difference between the reference signal RFCK and the oscillation signal OSCK can be set to a desired value corresponding to the type of reference signal RFCK. As described above, it is possible to synchronize time with high accuracy among a plurality of oscillators using different reference signals. Offset adjustment data for adjusting a phase difference between the reference signal RFCK and the oscillation signal OSCK is set in the third register 323, and thus a phase difference between the reference signal RFCK and the oscillation signal OSCK can be set to any desired value. As described above, it is possible to finely adjust a phase error including delay on a transmission path of the oscillation signal OSCK. The first register 321 stores phase comparison result data as the monitor data MTD, and thus the monitor data MTD can be output to an external device such as a test device. Consequently, it is possible to test an operation of the PLL circuit.

Here, an input signal based on the oscillation signal OSCK is the oscillation signal OSCK as described in FIG. 1, for example. However, embodiments of the invention are not limited thereto, and an input signal may be a signal obtained by buffering the oscillation signal OSCK, and may be a signal obtained through division of the oscillation signal OSCK. In FIG. 1, a description has been made of an exemplary case where the processor 50 performs offset adjustment, but this is only an example. For example, the phase comparator 40 may perform offset adjustment by adding offset adjustment data to the phase error data PED. In FIG. 1, a description has been made of an exemplary case where the register circuit 32 includes all of the first register 321, the second register 322, and the third register 323, but this is only an example. For example, the register circuit 32 may include any one or any two of the first register 321, the second register 322, and the third register 323. Performing a signal process on frequency control data based on a phase comparison result indicates that, for example, as described in FIG. 1, the processor 50 performs a loop filter process on the phase error data PED from the phase comparator 40 so as to generate frequency control data (frequency control data based on a phase comparison result), and performs a signal process on the frequency control data. The various embodiments of the invention are not limited thereto, and the phase comparator 40 may convert phase error data PED into frequency control data (frequency control data based on a phase comparison result), and the processor 50 may perform a signal process on the frequency control data.

In the present embodiment, the circuit device 500 may include a terminal which can be connected to a resonator for generating the oscillation signal OSCK. The oscillation signal OSCK may be a signal output from the terminal.

For example, as will be described later in FIG. 8, the oscillation signal generation circuit 140 includes an oscillation circuit 150 (VCO), and the oscillation circuit 150 is connected to a resonator XTAL via terminals TX1 and TX2. In this case, a signal output from the terminal TX1 or TX2 is the oscillation signal OSCK.

The phase comparator 40 performs phase comparison between an input signal based on the oscillation signal OSCK and the reference signal RFCK. A signal which is input to the phase comparator 40 is controlled to have a phase difference of zero. On the other hand, in a base station into which the oscillator is incorporated, the oscillation signal OSCK output from the terminal of the circuit device 500 is used as a clock signal. Thus, there is a probability that a phase difference may occur between the oscillation signal OSCK and the reference signal RFCK due to delay or the like in a feedback path to the phase comparator 40. In relation to this fact, according to the present embodiment, it is possible to adjust (finely adjust) a phase difference between the reference signal RFCK and the oscillation signal OSCK output from the terminal of the circuit device 500 by using offset adjustment data set in the third register 323.

In the present embodiment, test data for simulating phase comparison result data is input to the circuit device 500 as offset adjustment data in a test mode. Phase comparison result data obtained after the phase comparator 40 performs phase comparison is stored in the first register 321 as the monitor data MTD.

In the above-described way, if test data for simulating phase comparison result data is input instead of offset adjustment data, phase comparison result data in this case can be monitored. For example, an external device such as a test device can test an operation of the PLL circuit by monitoring phase comparison result data.

Here, the test data for simulating phase comparison result data is test data corresponding to phase comparison result data which is generated as a result of phase comparison performed in the phase comparator 40, and is data which is input as data replacing phase comparison result data in a test mode. Data corresponding to any phase comparison result data (fixed data or time-series data) can be input as the test data. The test mode is a mode which is set when an operation of the circuit device 500 is tested, for example, in test before shipment of the circuit device 500 or test before shipment of an electronic apparatus or the like into which the circuit device 500 is incorporated. For example, the test mode is set in a register circuit (for example, the register circuit 32 illustrated in FIG. 8) from an external device such as a tester.

In the present embodiment, the processor 50 performs offset adjustment on phase comparison result data on the basis of at least one of the first offset adjustment data and the second offset adjustment data, and generates the frequency control data DFCQ on the basis of the phase comparison result data having undergone the offset adjustment.

For example, as will be described later in FIG. 4, the processor 50 converts the phase error data PED from the phase comparator 40 into phase error data QPE. The phase error data QPE corresponds to phase comparison result data. The processor 50 adds the offset adjustment data OFTC to the phase error data QPE, and performs a loop filter process on phase error data QPEF as a result thereof so as to generate the frequency control data DFCQ. A (for example, inversely signed) phase difference corresponding to the offset adjustment data OFTC occurs between the oscillation signal OSCK generated on the basis of the frequency control data DFCQ and the reference signal RFCK. In this case, the phase error data QPE is inversely signed data of the offset adjustment data OFTC, and the phase error data QPE is added to the offset adjustment data OFTC, and thus the phase error data QPEF becomes (ideally) zero.

As mentioned above, the processor 50 performs offset adjustment on phase comparison result data on the basis of offset adjustment data, and thus a phase difference corresponding to the offset adjustment data is added between the oscillation signal OSCK based on the frequency control data DFCQ generated by the processor 50 and the reference signal RFCK. In the above-described way, a phase difference is adjusted by using the offset adjustment data.

In the present embodiment, GPS offset adjustment data and UTC offset adjustment data which are different from each other are set in the second register 322 as the first offset adjustment data.

As described above, there is a time difference between a GPS time pulse and a UTC time pulse. According to the present embodiment, GPS offset adjustment data and UTC offset adjustment data which are different from each other are set, and thus a phase difference corresponding to the time difference can be intentionally added to the oscillation signal OSCK. Consequently, it is possible to perform accurate time synchronization even in a case where either of the GPS time pulse and the UTC time pulse is used as the reference signal RFCK.

Specifically, the GPS offset adjustment data is offset adjustment data for adjusting a phase difference between the reference signal RFCK and an input signal based on the oscillation signal OSCK to a GPS predetermined value. The UTC offset adjustment data is offset adjustment data for adjusting a phase difference between the reference signal RFCK and an input signal based on the oscillation signal OSCK to a UTC predetermined value.

The GPS predetermined value and the UTC predetermined value are respectively values corresponding to GPS and UTC standards. Alternatively, the GPS predetermined value and the UTC predetermined value may be values based on actually measured values. For example, a predetermined value is set on the basis of a relative time difference between a GPS time pulse and a UTC time pulse. For example, in a case where there is a difference of 20 nanoseconds between a GPS time pulse and a UTC time pulse indicating the same time, a GPS predetermined value is set to zero, and a UTC predetermined value is set to 20 nanoseconds.

As mentioned above, if GPS offset adjustment data corresponding to a GPS predetermined value and UTC offset adjustment data corresponding to a UTC predetermined value are set, it is possible to perform accurate time synchronization even in a case where either of a GPS time pulse and a UTC time pulse is used as the reference signal RFCK.

In the present embodiment, the phase comparator 40 includes the counter 42 which performs a count operation by using an input signal based on the oscillation signal OSCK, and performs phase comparison of comparing a count value in the counter 42 in n (where n is an integer which can be set to 2 or more) cycles of the reference signal RFCK with the expected value n×FCW of the count value in an integer.

Here, n being an integer which can be set to an integer of 2 or more indicates that n can be set to 2 or more regardless of n being fixed or variable. In other words, in a case where n is fixed, n is set to any one of integers of 2 or more. In a case where n is set to be variable, n is variably set to any one of a plurality of integers including integers of 2 or more. A plurality of integers which can be set may further include 1. In addition, n may be set in a register circuit (for example, the register circuit 32 illustrated in FIG. 8) from an external device of the circuit device 500, or may be set by the circuit device 500 as will be described later in FIG. 7 or the like. Alternatively, n may be set by using a set value stored in a nonvolatile memory (for example, the register circuit 32 illustrated in FIG. 8), fuses, and the like.

According to the present embodiment, the phase comparator 40 performs phase comparison of comparing a count value in the counter 42 with an expected value in integers, and thus the phase comparator 40 can be formed with a simple configuration. Phase comparison results are expressed in integers, and thus it is possible to simplify a process on a phase error.

However, in a case where a count value and an expected value are compared with each other in integers, a phase error in the decimal accuracy cannot be detected, and thus a time resolution (the minimum phase error which can be detected) of a phase error increases compared with a case where a count value and an expected value are compared with each other in decimals. In relation to this fact, according to the present embodiment, the phase comparator 40 compares a count value in the counter 42 in n cycles of the reference signal RFCK with the expected value n×FCW of the count value in integers. In addition, n can be set to 2 or more. Consequently, the time resolution of a phase error can be reduced.

Figure 3:
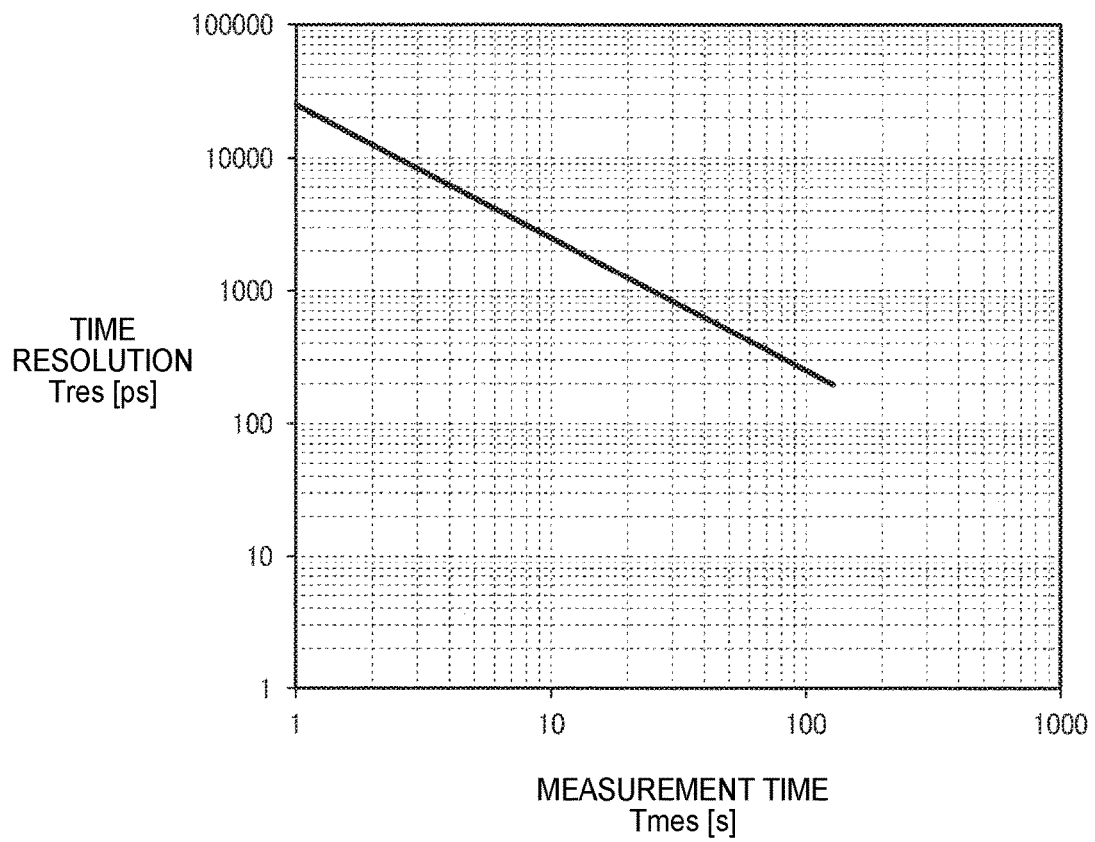
FIG. 3 is a diagram illustrating a relationship between measurement time and a time resolution.

Specifically, the time resolution Tres of a phase error is expressed by the following Equation (1). Tout indicates a cycle of the oscillation signal OSCK. FIG. 3 is a diagram illustrating a relationship between the measurement time Tmes and the time resolution Tres. FIG. 3 illustrates an example of a case where a cycle Tref of the reference signal RFCK is 1 second, and an oscillation frequency (1/Tout) is 40 MHz.

$$Tres = \frac{Tout}{Tmes/Tref} = \frac{Tout}{n} \quad (1)$$

It can be seen from the above Equation (1) and FIG. 3 that n is set to 2 or more so that the measurement time Tmes is increased, and thus the time resolution Tres is reduced. In other words, in the present embodiment, since n can be set to 2 or more, an oscillation signal can be synchronized with the reference signal RFCK with high accuracy, and thus an oscillation frequency can be made highly accurate.

In the present embodiment, n may be set to k1 (where k1 is an integer of 2 or more) in at least a lock state of the PLL circuit including the phase comparator 40.

As mentioned above, since n is set to an integer of 2 or more in the lock state, the time resolution of a phase error in the lock state is reduced, and thus an oscillation signal which is synchronized with the reference signal RFCK with high accuracy can be generated.

In the present embodiment, n may be set to k2 (where k2 is an integer of 1 or more and below k1) at the time of starting of the PLL circuit. The time of starting of the PLL circuit is the time (a so-called pull-in state) until the oscillation signal OSCK is synchronized with the reference signal RFCK after the PLL circuit starts an operation of synchronizing the oscillation signal OSCK with the reference signal RFCK.

In the present embodiment, n is set to k3 (where k3 is an integer of 1 or more and below k1) in the test mode.

As mentioned above, since n (k2 and k3) less than n=k1 in a lock state is set at the time of starting of the PLL circuit or in the test mode, the measurement time Tmes (that is, a cycle for phase comparison) is reduced, and thus the time until the lock state occurs from starting of a synchronization operation can be reduced. In other words, it is possible to achieve the same effect as in so-called gear shift which will be described later in FIG. 6.

In the present embodiment, n may be set to be variable. For example, as will be described later in FIG. 7, the circuit device 500 may set n to be variable. Alternatively, n may be set to be variable from an external device of the circuit device 500 via the register circuit or the like.

If n is set to be variable, n may be set to a great integer of 2 or more in order to obtain a highly accurate oscillation frequency in a lock state. On the other hand, n may be set to an integer smaller than that in the lock state in order to reduce the pull-in time during starting or the test mode.

In the present embodiment, the processor 50 performs, as signal processes (digital signal processes), at least one of a temperature compensation process, an aging correction process, and a process of correcting capacitance characteristics of a variable capacitance capacitor connected to a resonator for generating the oscillation signal OSCK, and also performs offset adjustment. Details of the temperature compensation process, the aging correction process, and the capacitance characteristic correction process will be described later.

As mentioned above, the processor 50 performs offset adjustment, and thus a desired phase difference can be added to the oscillation signal OSCK with respect to the reference signal RFCK. The processor 50 performs the temperature compensation process, the aging correction process, and the capacitance characteristic correction process in a time division manner along with the offset adjustment. For example, a DSP which will be described later in FIG. 15 executes a program in which the content of each process is described, and thus a plurality of processes can be performed by sharing a single item of hardware. Consequently, circuits of the processor 50 can be scaled down compared with a case where each process is performed by individual hardware.

In the present embodiment, the processor 50 performs a digital filter process (loop filter process) on the phase error data PED which is a phase comparison result.

As mentioned above, the processor 50 performs the digital filter process on the phase error data PED, and thus the processor 50 can generate frequency control data on the basis of the phase error data PED. Details of generation of the frequency control data will be described later in FIG. 6 and the like.

As will be described later in FIG. 8, the circuit device 500 may include the digital interface 30. The oscillation signal generation circuit 140 generates the frequency control data DFCQ and the oscillation signal OSCK based on phase comparison results in a first mode (internal PLL mode), and generates the frequency control data DFCQ and the oscillation signal OSCK based on externally generated frequency control data (DFCE in FIG. 8) which is input via the digital interface 30 in a second mode (external PLL mode).

In the above-described way, for example, a mode can be selected according to a use method desired by a user, and switching between control of an oscillation frequency using an internal PLL and control of an oscillation frequency using an external PLL can be performed. For example, in a case of a user who wants to cheaply obtain a synchronization clock of a small base station or the like, it is desirable to obtain a synchronization clock at low cost by using the circuit device 500 in the first mode. On the other hand, a user having knowhow on a method of generating a synchronization clock can utilize the knowhow by forming an external PLL and using the circuit device 500 in the first mode.

2. First Detailed Configuration of Circuit Device

Figure 4:
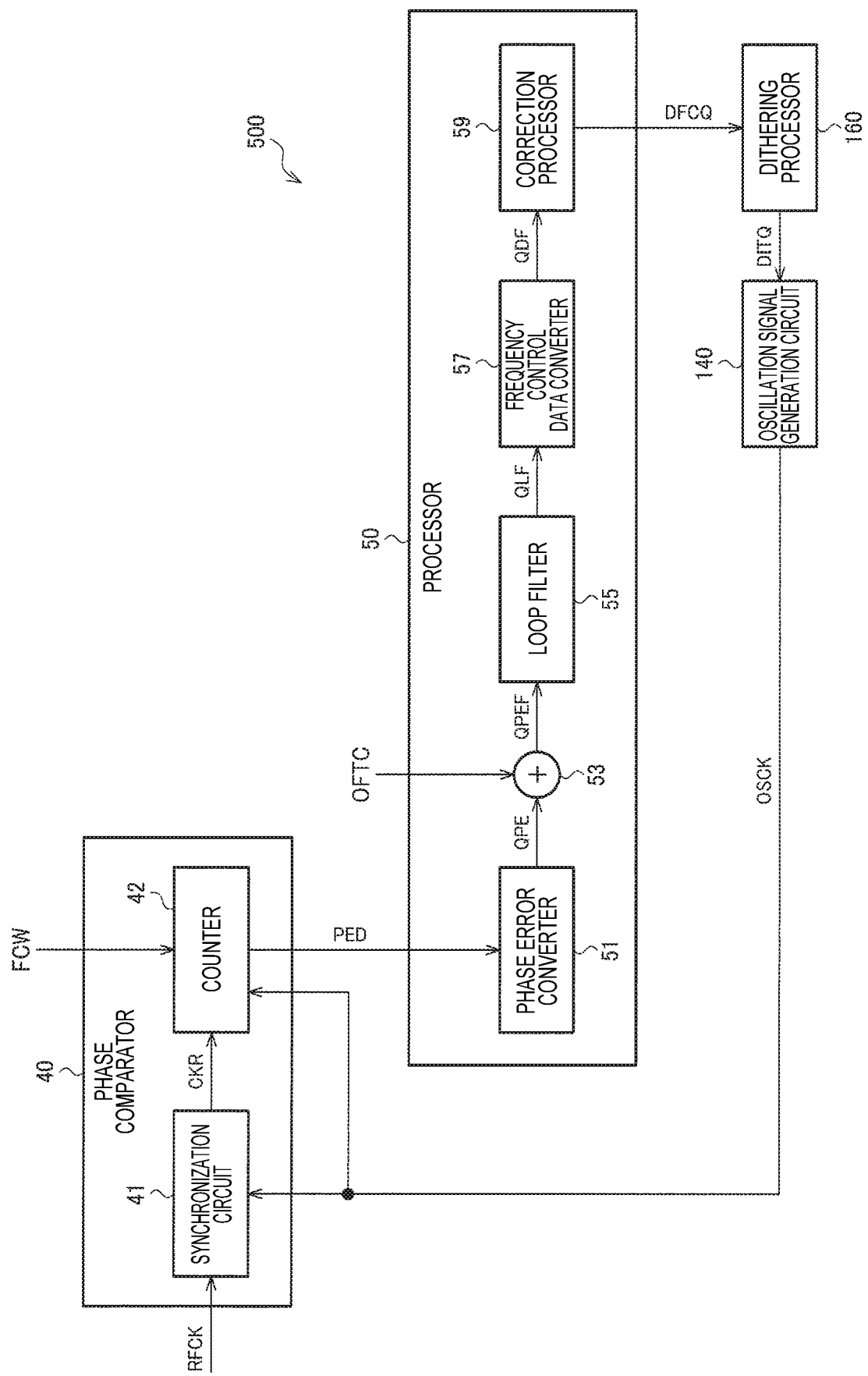
FIG. 4 is a diagram illustrating a first detailed configuration example of the circuit device, a detailed configuration example of the phase comparator, and a first detailed configuration example of a processor according to the embodiment.

FIG. 4 is a diagram illustrating a first detailed configuration example of the circuit device 500, a detailed configuration example of the phase comparator 40, and a first detailed configuration example of the processor 50 according to the present embodiment. The circuit device 500 includes the phase comparator 40, the processor 50, a dithering processor 160, and the oscillation signal generation circuit 140. The phase comparator 40 includes a synchronization circuit 41 and the counter 42. The processor 50 includes a phase error converter 51, an adder 53, a loop filter 55, a frequency control data converter 57, and a correction processor 59.

The synchronization circuit 41 synchronizes the reference signal RFCK with the oscillation signal OSCK. Specifically, the synchronization circuit 41 is formed of a flip-flop circuit or the like which incorporates the reference signal RFCK by using the oscillation signal OSCK. In other words, the synchronization circuit 41 incorporates a logic level of the reference signal RFCK at an edge of the oscillation signal OSCK with the flip-flop circuit, and outputs a clock signal CKR (or a pulse signal) whose logic level changes in synchronization with the edge of the oscillation signal OSCK.

The counter 42 sets a count value to the expected value n×FCW at a rising edge (or a falling edge) of the clock signal CKR, and counts down the number of clocks of the oscillation signal OSCK from the expected value n×FCW. A count value at a rising edge (or a falling edge) after n cycles of the clock signal CKR is output as the phase error data PED. Here, FCW indicates frequency setting data, and is input from, for example, the register circuit 32 in FIG. 8. For example, the frequency setting data FCW is written to the register circuit 32 from an external device via the digital interface 30. Alternatively, the frequency setting data FCW stored in the storage 34 may be read to the register circuit 32.

The phase error converter 51 converts the phase error data PED which is a difference between a count value inn cycles of the reference signal RFCK and the expected value n×FCW into a time difference corresponding to a phase difference between the reference signal RFCK and the oscillation signal OSCK for one second, and outputs the phase error data QPE as a result of the conversion. Specifically, calculation expressed by the following Equations (2) and (3) is performed. Here, Kpe indicates a conversion coefficient, fref indicates a frequency of the reference signal RFCK, and fout indicates a frequency of the oscillation signal OSCK.

$$QPE = Kpe \times PED \quad (2)$$

$$Kpe = \frac{fref}{n \times fout} \quad (3)$$

The adder 53 performs a process of adding the offset adjustment data OFTC to the phase error data QPE, and outputs the phase error data QPEF as a result of the addition process (offset adjustment). In other words, the phase error data QPE in FIG. 4 corresponds to phase comparison result data in FIG. 1. Since negative feedback control is performed so that a phase error after the offset adjustment is performed becomes zero, a phase error corresponding to the offset adjustment data OFTC is added between the reference signal RFCK and the oscillation signal OSCK in a lock state. The offset adjustment function may be selected to be enabled or disabled, and, in a case where the offset adjustment function is set to be disabled, the adder 53 outputs the phase error data QPE as the phase error data QPEF.

The loop filter 55 performs a digital filter process on the phase error data QPEF having undergone the offset adjustment, and outputs a result thereof as output data QLF. The digital filter process has, for example, a low-pass characteristic or a band-pass characteristic. For example, the loop filter 55 performs a process in which a proportion process of multiplying the phase error data QPEF by a coefficient is combined with an integration process of integrating the phase error data QPEF. A process performed by the loop filter 55 is not limited thereto, and may be a process of calculating the output data QLF so that the phase error data QPEF is close to zero (that is, the phase error data QPEF converges on the output data QLF when the PLL circuit is locked).

The frequency control data converter 57 converts the output data QLF from the loop filter 55 into frequency control data QDF. Specifically, calculation expressed by the following Equations (4) and (5) is performed. Here, Kdco indicates a conversion coefficient. In addition, $2^{16}-1$ is a range (that is, DITQ is 16-bit data) of values of frequency control data DITQ which is input to the oscillation signal generation circuit 140. Further, fmax indicates an upper limit frequency of a frequency change range of the oscillation signal OSCK, and fmin indicates a lower limit frequency of the frequency change range of the oscillation signal OSCK. For example, a frequency of the oscillation signal OSCK obtained in a case where the frequency control data DITQ having the maximum value $2^{16}-1$ is input to the oscillation signal generation circuit 140 is fmax, and a frequency of the oscillation signal OSCK obtained in a case where the frequency control data DITQ having the minimum value 0 is input to the oscillation signal generation circuit 140 is fmin. The various embodiments of the invention are not limited thereto, and, for example, a margin may be provided so that fmax and fmin may be set outside an actual oscillation frequency change range corresponding to a range of values of the frequency control data DITQ. For example, individual variations of resonators or the like may be measured, and fmax and fmin may be set on the basis of measurement results. Here, the frequency control data DITQ is 16 bits, but the frequency control data DITQ is not limited to 16 bits.

$$QDF = Kdco \times QLF \quad (4)$$

$$Kdco = \frac{(2^{16}-1) \times fout}{fmax - fmin} \quad (5)$$

The correction processor 59 performs various correction processes on the frequency control data QDF so as to output the frequency control data DFCQ having undergone the correction processes. As described above, the correction processes are, for example, the temperature compensation process and the capacitance characteristic correction process. The correction processor 59 may perform the aging correction process during hold-over so as to generate the frequency control data DFCQ.

Each element of the processor 50 may be formed of individual hardware, and may be formed of a program operating on the processor. In a case where each element of the processor 50 is formed of the program, for example, each element of the processor 50 is formed of a program module corresponding thereto. The program may be stored as data in a ROM or the like, and may be implemented in hardware such as a gate array which outputs data corresponding to the program.

The dithering processor 160 performs a dithering process on the frequency control data DFCQ so as to output the frequency control data DITQ having undergone the dithering process. The oscillation signal generation circuit 140 generates the oscillation signal OSCK having an oscillation frequency which is set on the basis of the frequency control data DITQ. For example, the processor 50 performs calculation by using 32-bit floating-point data. The dithering processor 160 converts the frequency control data DFCQ which is 32-bit floating-point data into the frequency control data DITQ which is 16-bit integer data, and performs a dithering process during the conversion. For example, the dithering process is a process of reducing or randomizing a quantization error when rounding off broken numbers.

Figure 5:
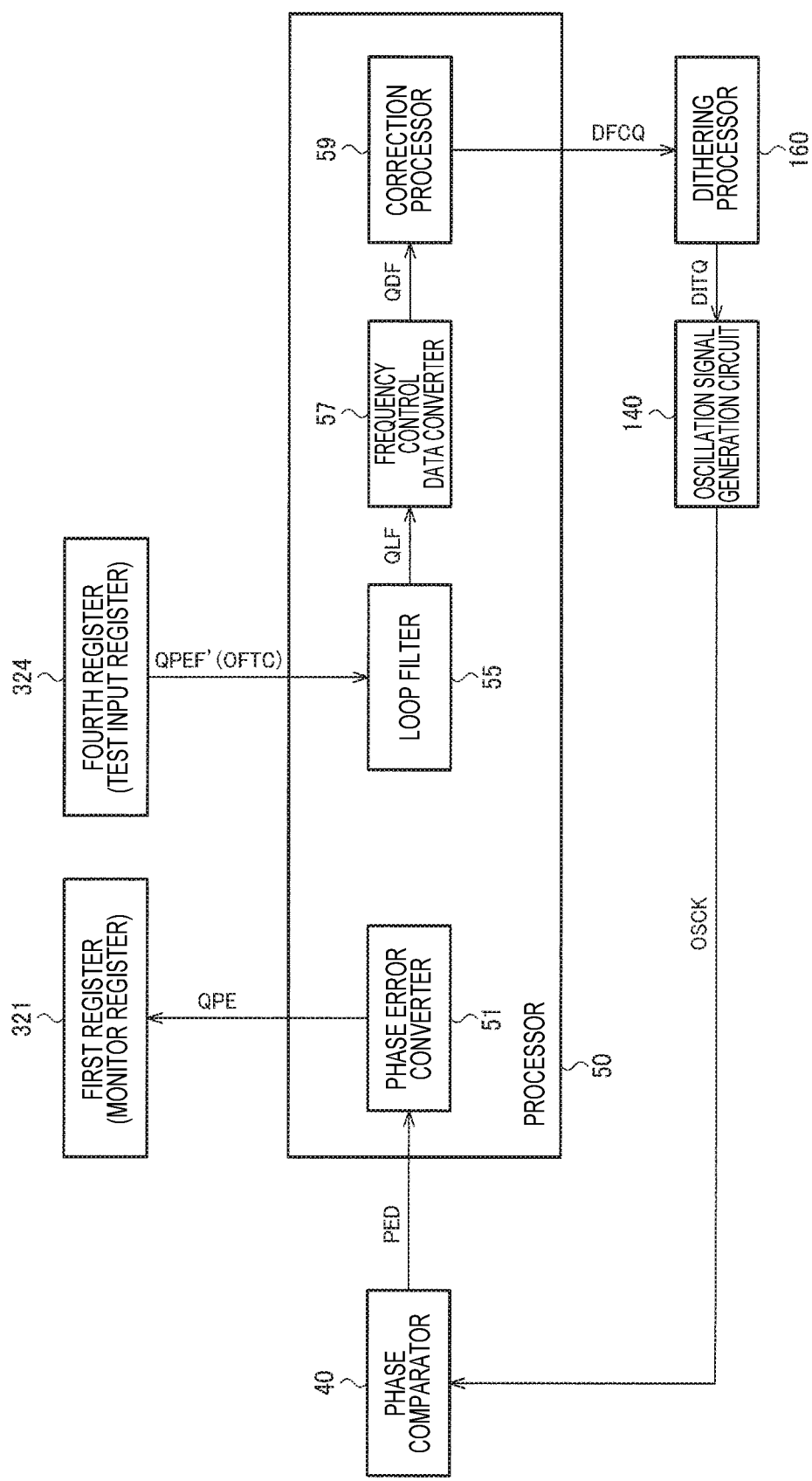
FIG. 5 is a diagram for explaining an operation in a test mode for performing an operation test of a PLL circuit.

FIG. 5 is a diagram for explaining an operation in the test mode for performing an operation test on the PLL circuit. As illustrated in FIG. 5, a loop is disconnected between the phase error converter 51 and the loop filter 55 in the test mode. Test data QPEF' is input to the loop filter 55 from the fourth register 324.

The test data QPEF' is data for simulating the phase error data QPE output from the phase error converter 51. In other words, the test data QPEF' is data for simulating a time difference corresponding to a phase difference between the reference signal RFCK and the oscillation signal OSCK for one second. The test data QPEF' corresponds to the offset adjustment data OFTC in FIG. 4, but the adder 53 does not perform an addition process thereon so that the test data QPEF' passes through the adder 53 so as to be output to the loop filter 55.

The test data QPEF' which is constant or changes in a time series manner is written to the fourth register 324 from a test device or the like. The loop filter 55, the frequency control data converter 57, and the correction processor 59 generate the frequency control data DFCQ on the basis of the test data QPEF', and the dithering processor 160 and the oscillation signal generation circuit 140 generate the oscillation signal OSCK having a frequency which is set on the basis of the frequency control data DFCQ. The phase comparator 40 and the phase error converter 51 generate the phase error data QPE of the reference signal RFCK and the oscillation signal OSCK, and the phase error data QPE is stored in the first register 321. In other words, in FIG. 5, the phase error data QPE corresponds to the monitor data MTD in FIG. 1.

3. Second Detailed Configuration of Circuit Device

Figure 6:
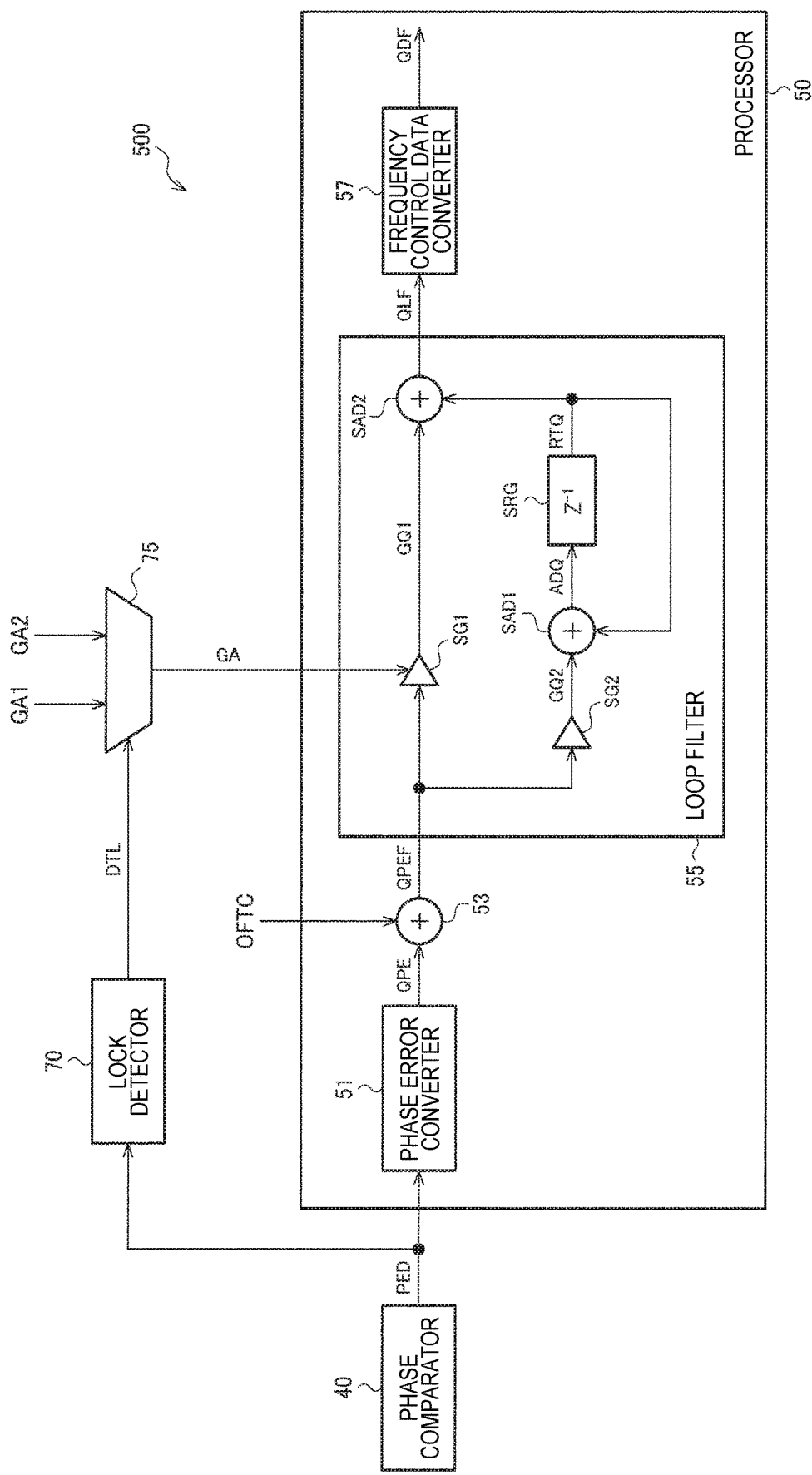
FIG. 6 is a diagram illustrating a second detailed configuration example of the circuit device and a detailed configuration example of a loop filter according to the embodiment.

FIG. 6 is a diagram illustrating a second detailed configuration example of the circuit device 500 and a detailed configuration example of the loop filter 55 according to the present embodiment. FIG. 6 does not illustrate the correction processor 59, the dithering processor 160, and the oscillation signal generation circuit 140.

The circuit device 500 includes the phase comparator 40, the processor 50, a lock detector 70 (lock detection circuit), and a selector 75. In FIG. 6, the loop filter 55 includes multipliers SG1 and SG2, adders SAD1 and SAD2, and a register SRG.

The lock detector 70 detects whether or not the PLL circuit is in a lock state on the basis of the phase error data PED, sets a lock detection signal DTL to be inactive (a first logic level; for example, a low level) in a case where the PLL circuit is not in a lock state, and sets the lock detection signal DTL to be active (a second logic level; for example, a high level) in a case where the PLL circuit is in a lock state. For example, the lock detector 70 determines that the PLL circuit is in a lock state in a case where the phase error data PED is within a predetermined range. For example, in a case where the phase error data PED is "0" in a lock state, the PLL circuit is determined as being in a lock state if $-1 \le PED \le +1$. The lock detector 70 is formed of, for example, a logic circuit. The lock detector 70 may be included in the processor 50.

The selector 75 selects a coefficient for a proportion process in the loop filter 55 on the basis of the lock detection signal DTL. Specifically, the selector 75 selects a coefficient GA1 in a case where the lock detection signal DTL is inactive, and selects a coefficient GA2 in a case where the lock detection signal DTL is active. The selector 75 outputs the selected coefficient as a coefficient GA. The coefficient GA2 is expressed in the following Equation (6). The coefficient GA1 is a coefficient satisfying a range shown in the following Expression (7). Here, fc indicates a cutoff frequency of the loop filter 55. The coefficients GA1 and GA2 are input from, for example, the register circuit 32 in FIG. 8.

$$GA2 = \frac{2\pi fc}{fref} \qquad (6)$$

$$GA2 \le GA1 \le 1 \qquad (7)$$

The multiplier SG1 of the loop filter 55 multiplies the phase error data QPEF by the coefficient GA for the proportion process so as to output a result thereof as output data GQ1.

The multiplier SG2 multiples the phase error data QPEF by a coefficient GRH for an integration process so as to output a result thereof as output data GQ2. The coefficient GRH is a coefficient satisfying a range shown in the following Expression (8). The coefficient GRH is input from, for example, the register circuit 32 in FIG. 8.

$$0 \le GRH \le \frac{(GA2)^2}{2} \qquad (8)$$

The adder SAD1 and the register SRG form an integrator. In other words, the adder SAD1 adds the output data GQ2 to output data RTQ from the register SRG, so as to output a result thereof as output data ADQ. The register SRG holds the output data ADQ, and outputs the held data as the output data RTQ.

The adder SAD2 adds the output data GQ1 which is a result of the proportion process to the output data RTQ which is a result of the integration process, and outputs a result thereof as output data QLF. A transfer function H(z) of the loop filter 55 is as in the following Equation (9).

$$H(z) = \frac{GA2 + (GRH - GA2)z^{-1}}{1 - z^{-1}} \qquad (9)$$

The coefficient GA1 for the proportion process selected in an unlock state is used for a function (hereinafter, referred to as gear shift function) of reducing the time required for the unlock state to converge on a lock state. In other words, as shown in the above Expression (7), in the unlock state, the proportion process is performed by using the coefficient GA1 more than the coefficient GA2 in the lock state. Consequently, an effect (negative feedback for a phase error) of causing a phase error to converge acts more strongly than in a lock state, and the time required to converge on a lock state is reduced more than in a case where the gear shift function is not used.

4. Modification Example of Counter

Figure 7:
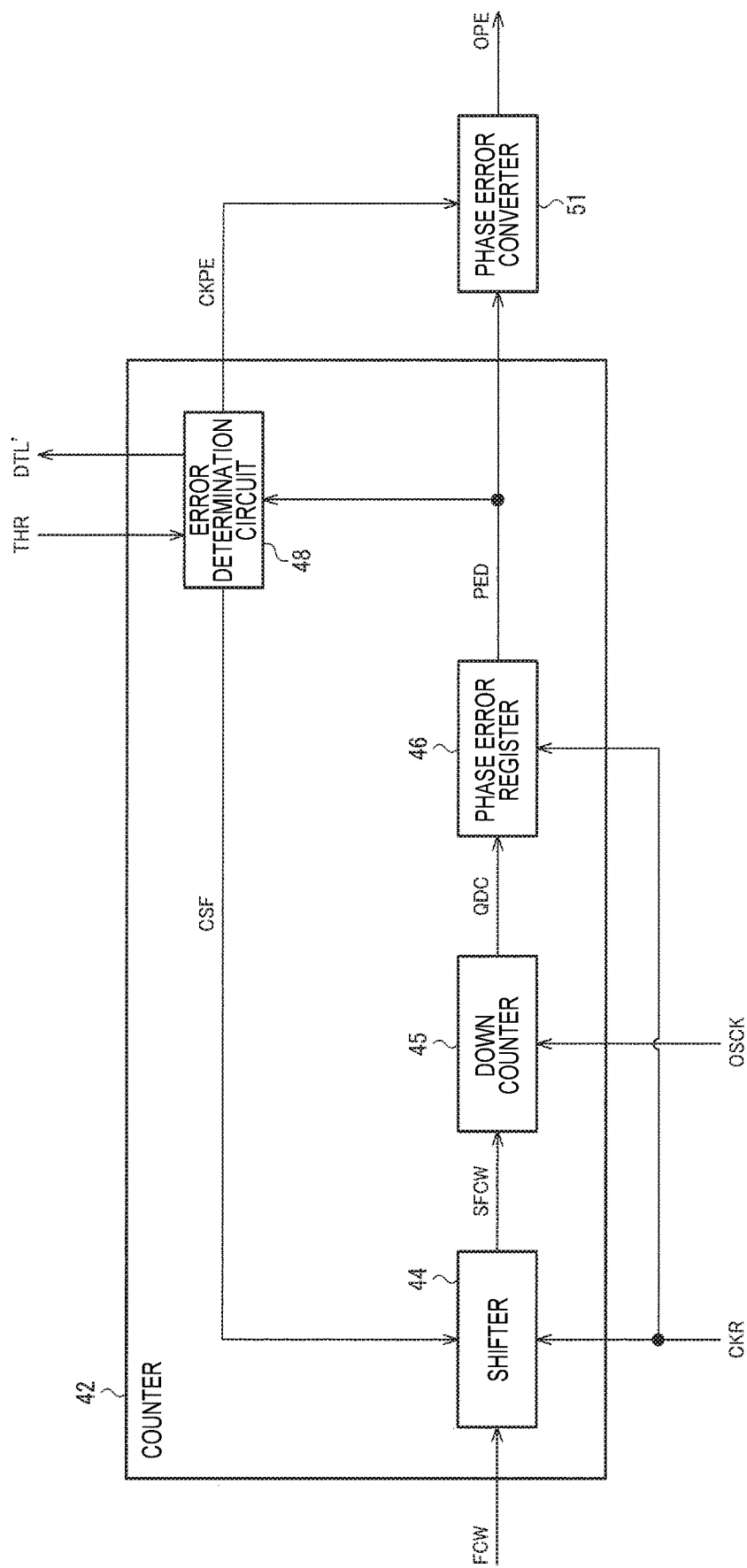
FIG. 7 is a diagram illustrating a modified configuration example of a counter.

FIG. 7 illustrates a modified configuration example of the counter 42. The counter 42 includes a shifter 44, a down counter 45, a phase error register 46, and an error determination circuit 48.

In this modification configuration example, the measurement time Tmes is controlled to be variable, and thus a function equivalent to the gear shift function is realized. In a case of using the modified configuration example, constituent elements (the lock detector 70 and the selector 75) related to the gearshift function in FIG. 6 may be omitted.

The shifter 44 shifts bits of the frequency setting data FCW in a shift amount corresponding to a shift amount control signal CSF. Specifically, n in the measurement time Tmes=n×Tref can be set to 2j (where j is an integer of 0 or more), and j indicates a shift amount. The shifter 44 shifts the frequency setting data FCW toward the MSB side by j bits, and outputs a result thereof as an expected value SFCW (=n×FCW). The shifter 44 updates the expected value SFCW at a rising edge (or a falling edge) of the clock signal CKR.

The down counter 45 initializes a count value to the expected value SFCW at a rising edge (or a falling edge) of the clock signal CKR. The down counter 45 counts down by using the oscillation signal OSCK up to a rising edge (or a falling edge) of the clock signal CKR for the measurement time Tmes, and outputs a count value QDC thereof.

The phase error register 46 incorporates the count value QDC in the down counter 45 at a rising edge (or a falling edge) of the clock signal CKR at the time of finishing of the measurement time Tmes, and outputs the incorporated count value as the phase error data PED.

The error determination circuit 48 determines whether or not an absolute value of the phase error data PED is equal to or smaller than a threshold value THR, and outputs the shift amount control signal CSF on the basis of a determination result. Specifically, the error determination circuit 48 increases a shift amount (the number of bits j) by 1 in a case where an absolute value of the phase error data PED is equal to or smaller than the threshold value THR. For example, a shift amount is increased by 1, such as j=0, 1, 2, . . . , and jmax. Here, jmax is the maximum value of a shift amount, and is a shift amount in a lock state (that is, n=2jmax in a lock state). An initial value of j may be an integer of 1 or more. In addition, j may be increased by an integer of 2 or more. The threshold value THR is input from, for example, the register circuit 32 in FIG. 8.

The error determination circuit 48 outputs a control signal CKPE for a conversion coefficient Kpe to the phase error converter 51 on the basis of the determination result. Specifically, the conversion coefficient Kpe depends on n as in the above Equation (3). The error determination circuit outputs the control signal CKPE for designating the conversion coefficient Kpe in a case of n=2j in conjunction with the shift amount j. For example, a conversion coefficient corresponding to each value of j may be stored in the register circuit 32 or the like in FIG. 8 in advance, and the phase error converter 51 may select the conversion coefficient Kpe according to the control signal CKPE. Alternatively, a conversion coefficient in a reference shift amount (for example, j=0) may be stored in the register circuit 32 or the like in FIG. 8, and the phase error converter 51 may perform calculation corresponding to the control signal CKPE on the conversion coefficient read from the register circuit 32 or the like so as to obtain the conversion coefficient Kpe.

The error determination circuit 48 outputs a lock detection signal DTL' on the basis of a determination result of whether or not an absolute value of the phase error data PED at j=jmax is equal to or smaller than the threshold value THR. In other words, in a case where an absolute value of the phase error data PED is equal to or smaller than the threshold value THR, the lock detection signal DTL' is made active.

5. Third Detailed Configuration of Circuit Device

FIG. 8 is a diagram illustrating a third detailed configuration example of the circuit device 500 according to the present embodiment.

The circuit device 500 includes a temperature sensor 10, an A/D converter 20 (A/D conversion circuit), the digital interface 30 (digital interface circuit), the register circuit 32, the storage 34 (memory), the phase comparator 40, the processor 50, the lock detector 70, a reference signal detection circuit 47, and the oscillation signal generation circuit 140.

The temperature sensor 10 outputs a temperature detection voltage VTD. Specifically, a temperature-dependent voltage which changes depending on the temperature of the environment (circuit device 500) is output as the temperature detection voltage VTD. For example, the temperature sensor 10 may be formed of a diode or a bipolar transistor. A forward voltage of a PN junction included in the diode or the bipolar transistor corresponds to the temperature detection voltage VTD.

The A/D converter 20 performs A/D conversion on the temperature detection voltage VTD from the temperature sensor 10 so as to output temperature detection data DTD. For example, the digital temperature detection data DTD (A/D result data) corresponding to an A/D conversion result of the temperature detection voltage VTD is output. As an A/D conversion method in the A/D converter 20, for example, a successive comparison method or a method similar to the successive comparison method may be employed. An A/D conversion method is not limited to such methods, and various methods (a counting type, a parallel comparison type, and a series/parallel type) may be employed.

A resonator XTAL is provided outside the circuit device 500, and is, for example, an AT cut or SC cut quartz crystal resonator which is of a thickness shear vibration type, or a flexural vibration type piezoelectric resonator. The resonator XTAL may be a resonator (an electromechanical resonator or an electrical resonance circuit). As the resonator XTAL, a surface acoustic wave (SAW) resonator as a piezoelectric resonator, a microelectromechanical system (MEMS) resonator as a silicon resonator, and the like may be used. As a substrate material of the resonator XTAL, a piezoelectric single crystal of quartz crystal, Lithium Tantalate, or Lithium Niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The oscillation signal generation circuit 140 includes a D/A converter 80 and the oscillation circuit 150. The D/A converter 80 performs D/A conversion on the frequency control data DFCQ from the processor 50. As a D/A conversion type of the D/A converter 80, for example, a resistance string type (resistance division type) may be employed. However, a D/A conversion type is not limited thereto, and various types such as a resistance ladder type (R-2R ladder type or the like), a capacitor array type, and a pulse width modulation type may be employed. The D/A converter 80 may include a control circuit, a modulation circuit (a PWM circuit), a filter circuit, or the like, in addition to a D/A converter. The oscillation circuit 150 generates the oscillation signal OSCK by using an output voltage VQ from the D/A converter 80, and the resonator XTAL. The oscillation circuit 150 causes the resonator XTAL (a piezoelectric resonator, a resonator, or the like) to oscillate so as to generate the oscillation signal OSCK. Specifically, one end of the resonator XTAL is connected to the oscillation circuit 150 via a first resonator terminal TX1 of the circuit device 500, and the other end of the resonator XTAL is connected to the oscillation circuit 150 via a second resonator terminal TX2 of the circuit device 500. The oscillation circuit 150 causes the resonator XTAL to oscillate at an oscillation frequency at which the output voltage VQ of the D/A converter 80 is used as a frequency control voltage (oscillation control voltage). For example, in a case where the oscillation circuit 150 is a circuit (VCO) which controls oscillation of the resonator XTAL through voltage control, the oscillation circuit 150 may include a variable capacitance capacitor (a varicap or the like) whose capacitance value varies depending on a frequency control voltage.

The reference signal detection circuit 47 detects whether or not the reference signal RFCK is absent or abnormal, and outputs a reference signal detection signal SYNCCLK on the basis of a detection result. In a case where it is detected that the reference signal RFCK is present or normal, the detection signal SYNCCLK becomes active (second logic level). In a case where it is detected that the reference signal RFCK is absent or abnormal, the detection signal SYNC-CLK becomes inactive (first logic level). For example, the reference signal detection circuit 47 detects whether or not the reference signal RFCK is absent or abnormal by monitoring a pulse (or a frequency) of the reference signal RFCK. For example, a pulse interval of the reference signal RFCK is measured with a counter or the like, and in a case where it is determined that pulses are not input for a predetermined period on the basis of a count value, the reference signal RFCK is determined as being absent or being abnormal. Alternatively, in a case where an input interval of pulses continues in a state of exceeding a predetermined range for a predetermined period on the basis of a count value, the reference signal RFCK is determined as being absent or being abnormal.

The storage 34 stores various pieces of information which is necessary in various processes or operations of the circuit device 500. The storage 34 may be implemented by, for example, a nonvolatile memory. As the nonvolatile memory, for example, an EEPROM may be used. For example, a metal-oxide-nitride-oxide-silicon (MONOS) type memory may be used as the EEPROM. Alternatively, memories of other types such as a floating gate type may be used as the EEPROM. The storage 34 may be implemented by, for example, a fuse circuit as long as information can be held and stored even in a state in which power is not supplied.

The register circuit 32 is a circuit formed of a plurality of registers such as a status register, a command register, and a data register. An external device (for example, a processor such as a CPU or an MPU) of the circuit device 500 accesses each register of the register circuit 32 via the digital interface 30. The external device can check a status of the circuit device 500, issue a command to the circuit device 500, transmit data to the circuit device 500, and read data from the circuit device 500, by using the register of the register circuit 32. The register circuit 32 stores information which is read from the storage 34. For example, parameters such as the above-described conversion coefficients Kpe and Kdco, the offset adjustment data OFTC, and the coefficients GA1, GA2 and GRH are stored in the storage 34. The parameters are read (initially loaded) to the register circuit 32, for example, at the time of starting of the circuit device 500. The processor 50 performs a process using the parameters by referring to the register circuit 32.

The processor 50 includes an internal PLL processor 83, a hold-over processor 52, a Karman filter 54, an aging corrector 56 (an aging correction processing circuit or a program module), and a temperature compensator 58. The Karman filter 54, the aging corrector 56, and the temperature compensator 58 correspond to the correction processor 59 in FIG. 4. The internal PLL processor 83 corresponds to the phase error converter 51, the adder 53, the loop filter 55, and the frequency control data converter 57 described in FIG. 4 or the like. Hereinafter, a process performed by the internal PLL processor 83 will be referred to as an internal PLL process. The hold-over processor 52 performs various processes regarding hold-over. The Karman filter 54 performs a process of estimating a true value for an observed value of frequency control data. The aging corrector 56 performs aging correction for compensating for a frequency change due to aging during hold-over. The temperature compensator 58 performs a temperature compensation process on an oscillation frequency on the basis of the temperature detection data DTD from the A/D converter 20.

The digital interface 30 is an interface for inputting and outputting digital data between the circuit device 500 and an external device (for example, a microcomputer or a controller). The digital interface 30 may be implemented on the basis of, for example, a synchronous serial communication method using serial clock lines and serial data lines. Specifically, the digital interface 30 may be implemented on the basis of an inter-integrated circuit (I2C) method or a 3-wire or 4-wire serial peripheral interface (SPI) method. The I2C method is a synchronous serial communication method of performing communication by using two signal lines such as a serial clock line SCL and a bidirectional serial data line SDA. The SPI method is a synchronous serial communication method of performing communication by using a serial clock line SCK and two unidirectional serial data lines SDI and SDO. The digital interface 30 is formed of an input/output buffer circuit, a control circuit, and the like realizing such a communication method.

The reference signal RFCK is input to the circuit device 500 via a connection terminal (pad) of the circuit device 500. A signal PLOCK for performing a notification of whether or not an external PLL circuit is in a lock state is input to the circuit device 500 via the connection terminal (pad) of the circuit device 500. The signal PLOCK may be input to the circuit device 500 via the digital interface 30. For example, the signal PLOCK becomes inactive in a case where the external PLL circuit is not in a lock state, and becomes active in a case where the external PLL circuit is in a lock state.

In the present embodiment, for example, if an external device writes mode setting information to the register circuit 32 via the digital interface 30, one of the internal PLL mode (first mode) and the external PLL mode (second mode) is set.

In the internal PLL mode, the processor 50 performs an internal PLL process on the basis of the phase error data PED from the phase comparator 40, so as to generate frequency control data (QDF in FIG. 4). The processor 50 performs signal processes such as a temperature compensation process on the frequency control data QDF so as to output the frequency control data DFCQ having undergone the signal processes to the oscillation signal generation circuit 140. The oscillation signal generation circuit 140 generates the oscillation signal OSCK by using the frequency control data DFCQ and the resonator XTAL so as to output the oscillation signal OSCK to the phase comparator 40. Consequently, a loop of a PLL circuit (internal PLL circuit) is formed by the phase comparator 40, the oscillation signal generation circuit 140, and the like.

In the external PLL mode, frequency control data DFCE (externally generated frequency control data) from an external frequency control data generator is input to the processor 50 via the digital interface 30. The processor 50 performs signal processes such as a temperature compensation process on the frequency control data DFCE so as to output the frequency control data DFCQ having undergone the signal processes to the oscillation signal generation circuit 140. The oscillation signal generation circuit 140 generates the oscillation signal OSCK by using the frequency control data DFCQ and the resonator XTAL so as to output the oscillation signal OSCK to the external frequency control data generator. Consequently, a loop of a PLL circuit (external PLL circuit) is formed by the external frequency control data generator, the oscillation signal generation circuit 140, and the like.

The external frequency control data generator compares an input signal based on the oscillation signal OSCK with the reference signal RFCK so as to generate the frequency control data DFCE. For example, the external frequency control data generator may include a comparison calculator which performs comparison calculation between the oscillation signal OSCK and the reference signal RFCK, and a digital filter which performs a smoothing process on phase error data. Alternatively, the external frequency control data generator may include a phase comparator of an analog circuit, a filter (loop filter) of an analog circuit, and an A/D converter.

6. Second Detailed Configuration of Processor

Figure 9:
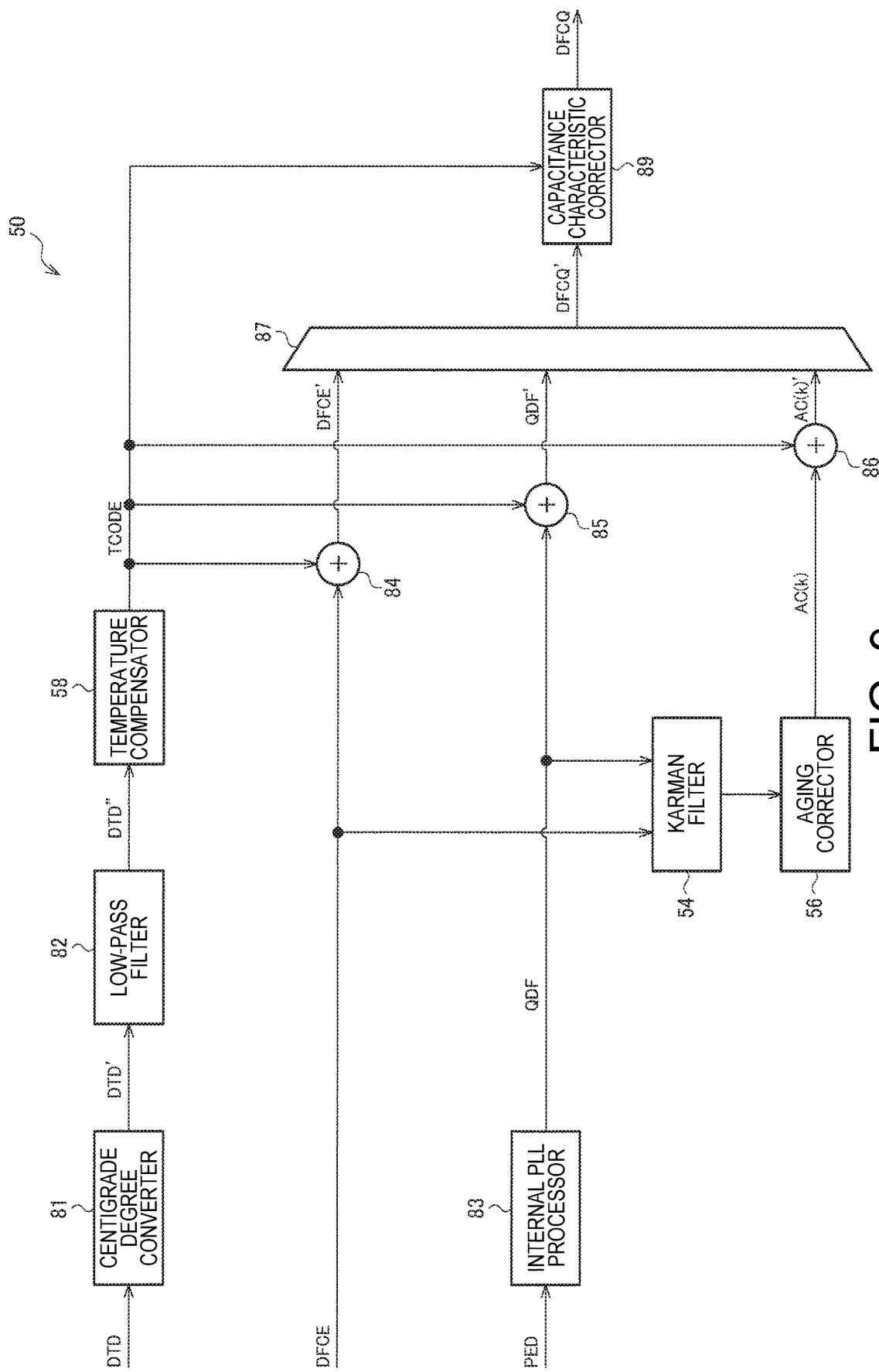
FIG. 9 is a second detailed configuration example of the processor.

FIG. 9 is a second detailed configuration example of the processor 50. The processor 50 includes a centigrade degree converter 81, a low-pass filter 82, the temperature compensator 58, the internal PLL processor 83, the Karman filter 54, the aging corrector 56, a capacitance characteristic corrector 89, adders 84, 85 and 86, and a selector 87. The Karman filter 54, the aging corrector 56, the temperature compensator 58, and the capacitance characteristic corrector 89 correspond to the correction processor 59 in FIG. 4.

The centigrade degree converter 81 converts the temperature detection data DTD into temperature detection data DTD' indicating a Celsius temperature (in a broad sense, corresponding to a Celsius temperature). For example, the temperature detection data DTD indicating nonlinear characteristics with respect to a Celsius temperature is converted into the temperature detection data DTD' indicating linear characteristics with respect to a Celsius temperature.

The low-pass filter 82 performs a digital filter process for smoothing a temporal change in the temperature detection data DTD' so as to output temperature detection data DTD'' having undergone the digital filter process.

The temperature compensator 58 performs a temperature compensation process on the basis of the temperature detection data DTD'', and generates temperature compensation data TCODE (temperature compensation code) for maintaining an oscillation frequency to be constant with respect to a temperature change. Specifically, information regarding coefficients $A_0$ to $A_5$ of a polynomial (approximate function) in Equation (10) is stored in the storage 34 in FIG. 8. Here, X corresponds to the temperature detection data DTD''. The temperature compensator 58 reads the information regarding the coefficients $A_0$ to $A_5$ from the storage 34, and performs calculation expressed in the following Equation (10) on the basis of the coefficients $A_0$ to $A_5$ and the temperature detection data DTD'' (=X) so as to generate the temperature compensation data TCODE.

$$\text{TCODE} = A_5 \cdot X^5 + A_4 \cdot X^4 + A_3 \cdot X^3 + A_2 \cdot X^2 + A_1 \cdot X + A_0 \tag{10}$$

The adder 84 adds the temperature compensation data TCODE to the frequency control data DFCE which is input from the external frequency control data generator in the external PLL mode, and outputs a result thereof as frequency control data DFCE'. The frequency control data DFCE may be output as the frequency control data DFCE'.

The internal PLL processor 83 performs an internal PLL process on the basis of the phase error data PED which is input from the phase comparator 40 in the internal PLL mode, and outputs the frequency control data QDF.

The adder 85 adds the temperature compensation data TCODE to the frequency control data QDF, and outputs a result thereof as frequency control data QDF'. The frequency control data QDF may be output as the frequency control data QDF'.

The Karman filter 54 performs a process of estimating a true value for an observed value of frequency control data (DFCE and QDF) through a Karman filter process in a period (normal operation period) before a hold-over state caused by the absence or abnormality of the reference signal RFCK is detected. This true value is a true value estimated through the Karman filter process, and thus cannot be said to be a real true value. A control process performed due to detection of a hold-over state is performed by the hold-over processor 52 illustrated in FIG. 8. Details of the Karman filter process will be described later.

The aging corrector 56 holds a true value at a timing corresponding to a detection timing of a hold-over state in a case where the hold-over state is detected. A timing at which the true value is held may be a timing at which a hold-over state is detected, and may be a timing prior to the timing. The aging corrector 56 generates frequency control data AC(k) having undergone aging correction by performing a calculation process based on the held true value. Details of the aging correction process will be described later.

The adder 86 adds the temperature compensation data TCODE to the frequency control data AC(k), and outputs a result thereof as frequency control data AC(k)'. The frequency control data AC(k) may be output as the frequency control data AC(k)'.

The selector 87 selects the frequency control data DFCE' in the external PLL mode during non-hold-over (normal operation), selects the frequency control data QDF' in the internal PLL mode during non-hold-over, and selects the frequency control data AC(k) ' during hold-over. The selector 87 outputs the selected frequency control data as the frequency control data DFCQ'.

The capacitance characteristic corrector 89 performs a correction process on the frequency control data DFCQ' so that the frequency control data DFCQ' uniquely corresponds to an oscillation frequency (the same oscillation frequency is obtained with respect to the same frequency control data DFCQ'), and outputs a result thereof as the frequency control data DFCQ. Specifically, the variable capacitance capacitor (for example, CX1 in FIG. 18) of the oscillation circuit 150 changes the capacitance thereof for a control voltage depending on, for example, an individual variation or a temperature change. The capacitance characteristic corrector 89 performs correction of canceling (reducing) changes in capacitance characteristics. For example, the capacitance characteristic corrector 89 performs a first correction process of canceling (reducing) an individual variation of capacitance characteristics, a second correction process of canceling (reducing) a temperature change of the capacitance characteristics on the basis of the temperature compensation data TCODE, and a third correction process of canceling (reducing) nonlinearity of the capacitance characteristics (capacitance characteristics for the frequency control data DFCQ' are made linear). The first to third correction processes are performed through calculation of correction expressions corresponding to the respective correction processes. Parameters (coefficients and the like) used for the correction expressions are stored in, for example, the storage 34 in FIG. 8. The parameters are read to the register circuit 32 from the storage 34, and are input to the processor 50 from the register circuit 32. Each of the first to third correction processes may be selected to be enabled and disabled.

7. Process Flow

Figure 10:
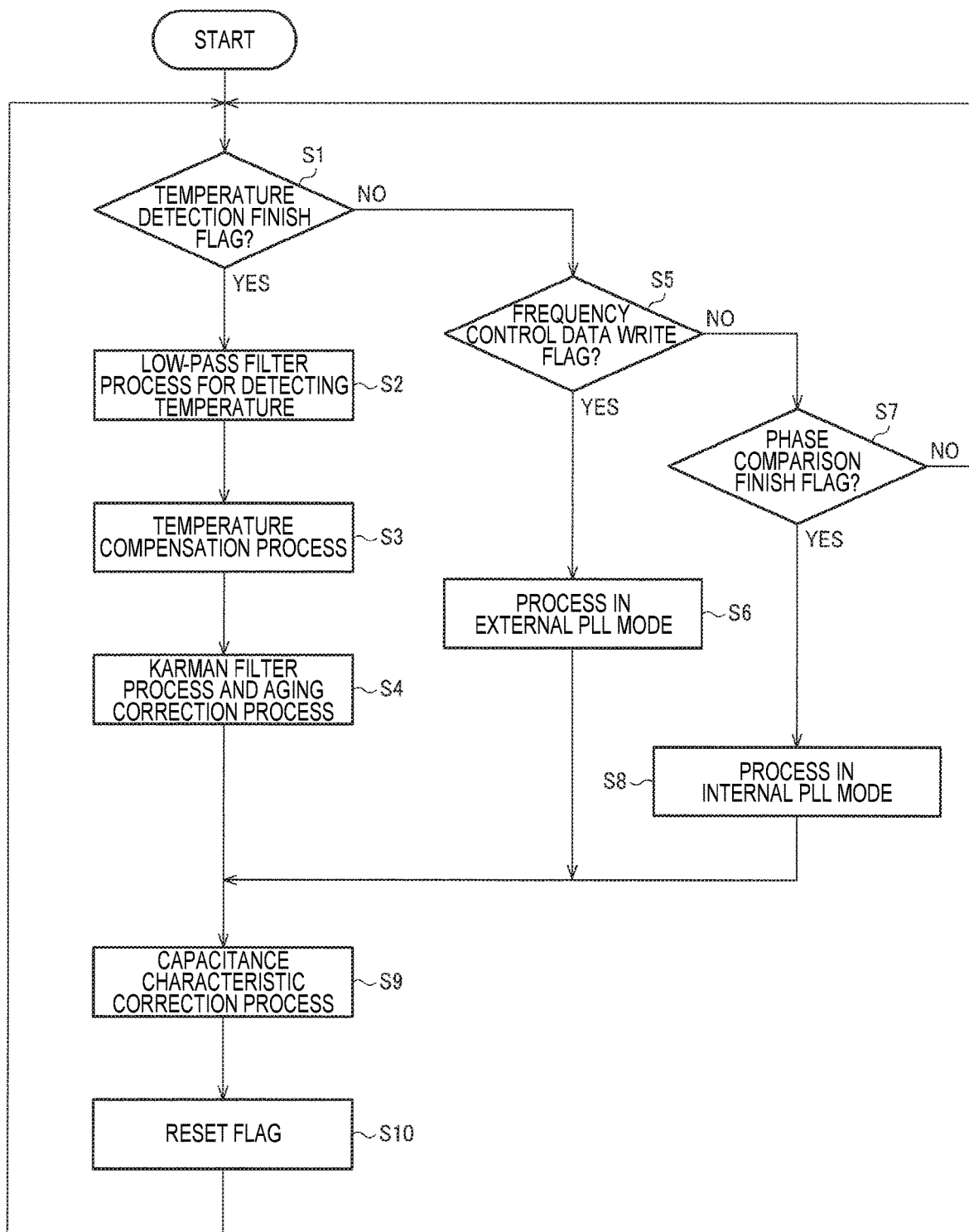
FIG. 10 is a flowchart illustrating a process performed by the processor.

FIG. 10 is a flowchart illustrating a process performed by the processor 50.

If the process is started, the processor 50 determines whether or not a temperature detection finish flag is active (step S1). The temperature detection finish flag becomes active in a case where the A/D converter 20 outputs (updates) the temperature detection data DTD.

In a case where the temperature detection finish flag is active, the processor 50 performs a low-pass filter process for detecting a temperature (step S2). In other words, the centigrade degree converter 81 converts the temperature detection data DTD into centigrade, and the low-pass filter 82 performs a low-pass filter process on the temperature detection data DTD'. Next, the temperature compensator 58 performs a temperature compensation process on the basis of the temperature detection data DID" having undergone the low-pass filter process, and generates the temperature compensation data TCODE (step S3). Next, the Karman filter 54 performs a Karman filter process on the basis of the frequency control data DFCE or QDF. The aging corrector 56 performs an aging correction process during hold-over (step S4). Next, the flow proceeds to step S9.

In a case where the temperature detection finish flag is inactive in step S1, it is determined whether or not a frequency control data write flag is active (step S5). The frequency control data write flag becomes active in a case where the frequency control data DFCE is input (written to the register circuit 32, for example) via the digital interface 30 from the external frequency control data generator.

In a case where the frequency control data write flag is active, the processor 50 performs a process in the external PLL mode (step S6). Specifically, the adder 84 and the selector 87 perform this process. Next, the flow proceeds to step S9.

In a case where the frequency control data write flag is inactive, it is determined whether or not a phase comparison finish flag is active (step S7). The phase comparison finish flag becomes active in a case where the phase comparator 40 outputs (updates) the phase error data PED. Specifically, the phase comparison finish flag becomes active every n cycles of the reference signal RFCK. Alternatively, the phase comparison finish flag may also become active when the phase comparator 40 outputs the phase error data PED for each cycle of the reference signal RFCK. In this case, for example, the same phase error data PED is output for n times, and a value of the phase error data PED changes every n cycles of the reference signal RFCK.

In a case where the phase comparison finish flag is active, the processor 50 performs a process in the internal PLL mode (step S8). Specifically, the internal PLL processor 83, the adder 85, and the selector 87 perform this process. Next, the flow proceeds to step S9.

In a case where the phase comparison finish flag is inactive, the flow returns to step S1, and the loop is repeated until any one of the temperature detection finish flag, the frequency control data write flag, and the phase comparison finish flag becomes active so that flag waiting is performed.

In step S9, the capacitance characteristic corrector 89 performs a capacitance characteristic correction process on the frequency control data DFCQ' which is a process result in any one of steps S4, S6 and S8, and outputs the frequency control data DFCQ to the oscillation signal generation circuit 140 (or the dithering processor 160) (step S9). Next, the processor 50 resets the flags (step S10). Specifically, among the temperature detection finish flag, the frequency control data write flag, and the phase comparison finish flag, a flag which is active is reset to be inactive. Next, the flow returns to step S1, and flag waiting is performed.

Figure 11:
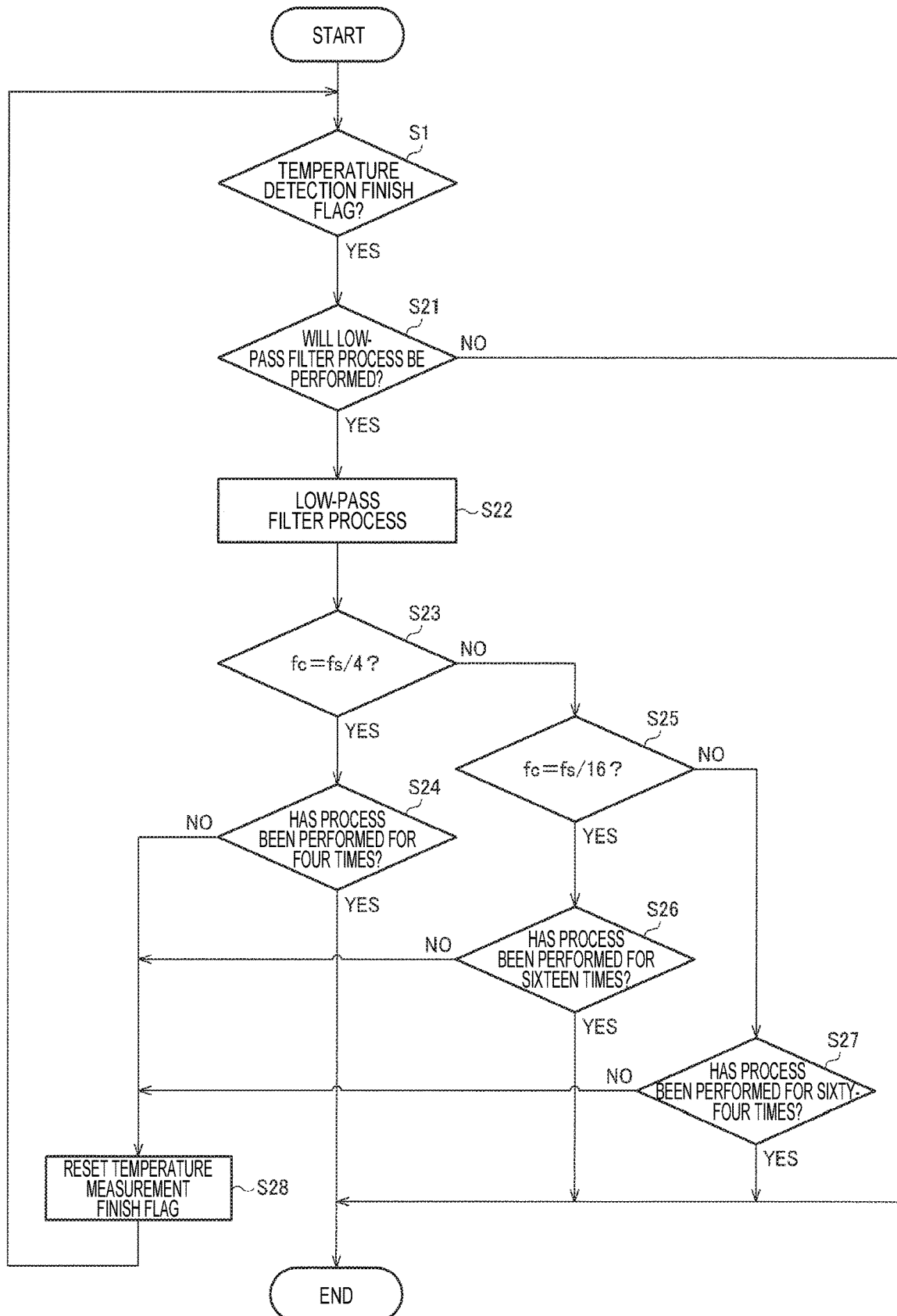
FIG. 11 is a flowchart illustrating details of a low-pass filter process for detecting temperature.

FIG. 11 is a flowchart illustrating details of the low-pass filter process (step S2) for detecting a temperature.

The processor 50 determines whether or not the low-pass filter process is set to be enabled (step S21). In a case where the low-pass filter process is set to be disabled, the process is finished without performing the low-pass filter process. A centigrade conversion process is performed, for example, before step S21.

In a case where the low-pass filter process is set to be enabled, the low-pass filter 82 performs the low-pass filter process on the temperature detection data DTD' (step S22). Next, it is determined whether or not the cutoff frequency fc in the low-pass filter process is set to fs/4 (step S23). Here, fs indicates an operation frequency of the low-pass filter process. In other words, fs indicates a sampling frequency for the temperature detection data DTD (a frequency at which the A/D converter 20 outputs the temperature detection data DTD).

In a case where the cutoff frequency fc is set to fs/4, the processor 50 determines whether or not the low-pass filter process is performed for four times (whether or not the low-pass filter process is performed on the temperature detection data DTD which is input for four times) (step S24). The process is finished in a case where the low-pass filter process is performed for four times. In a case where the low-pass filter process is not performed for four times, a temperature measurement finish flag is reset to be inactive (step S28), and the flow returns to step S1.

In a case where the cutoff frequency fc is not set to be fs/4, it is determined whether or not the cutoff frequency fc in the low-pass filter process is set to fs/16 (step S25).

In a case where the cutoff frequency fc is set to fs/16, the processor 50 determines whether or not the low-pass filter process is performed for sixteen times (whether or not the low-pass filter process is performed on the temperature detection data DTD which is input for sixteen times) (step S26). The process is finished in a case where the low-pass filter process is performed for sixteen times. In a case where the low-pass filter process is not performed for sixteen times, the temperature measurement finish flag is reset to be inactive (step S28), and the flow returns to step S1.

In a case where the cutoff frequency fc is not set to be fs/16, the cutoff frequency fc is set to fs/64, and thus the processor 50 determines whether or not the low-pass filter process is performed for sixty-four times (whether or not the low-pass filter process is performed on the temperature detection data DTD which is input for sixty-four times) (step S27). The process is finished in a case where the low-pass filter process is performed for sixty-four times. In a case where the low-pass filter process is not performed for sixty-four times, the temperature measurement finish flag is reset to be inactive (step S28), and the flow returns to step S1.

Figure 12:
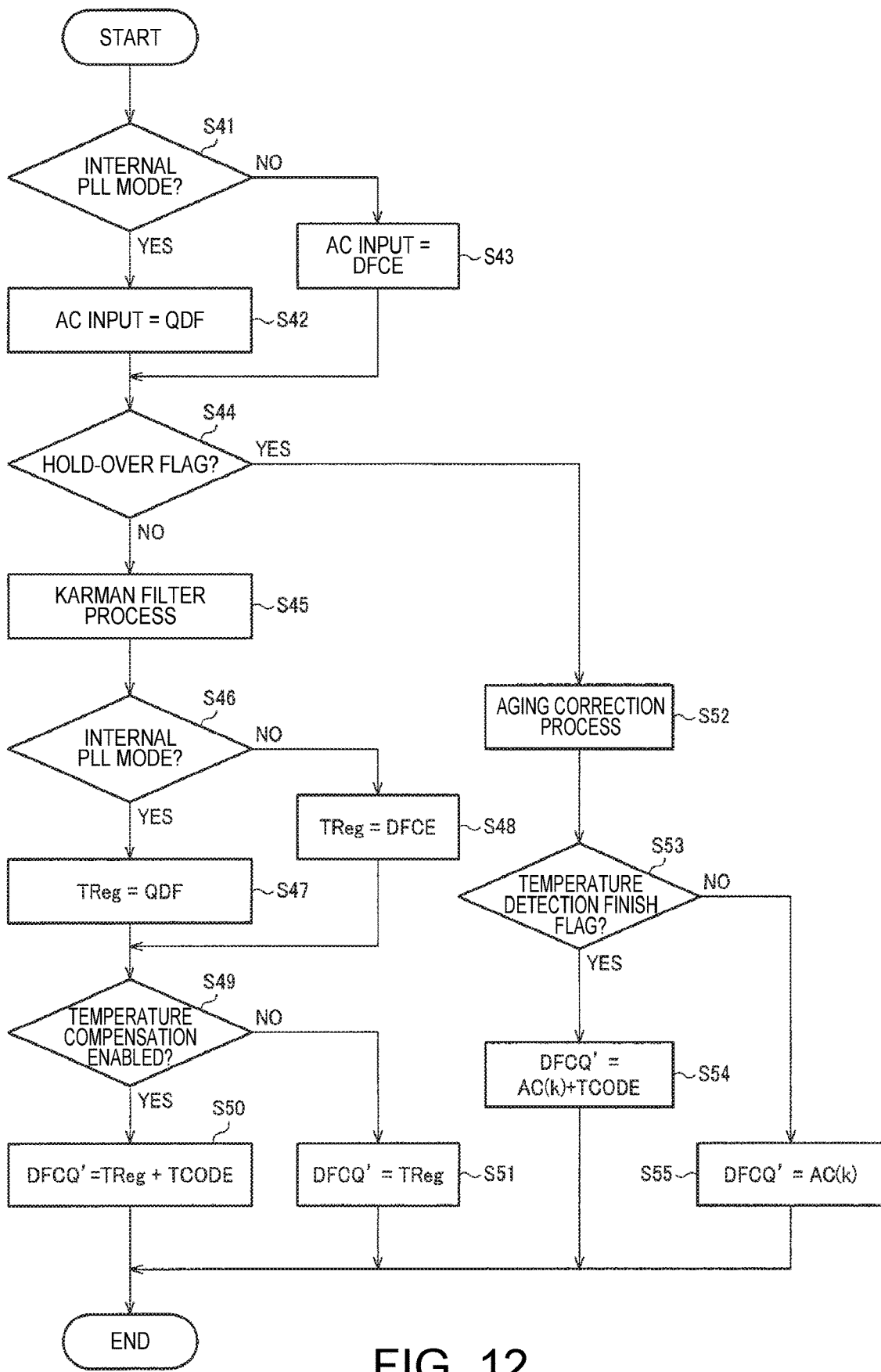
FIG. 12 is a flowchart illustrating details of a Karman filter process and an aging correction process.

FIG. 12 is a flowchart illustrating details of the Karman filter process and the aging correction process (step S4).

The processor 50 determines whether or not the internal PLL mode is set (step S41). In a case where the internal PLL mode is set, the frequency control data QDF is stored in an input register (AC input) for the Karman filter process (step S42). In a case where the external PLL mode is set (the internal PLL mode is not set), the frequency control data DFCE is stored in the input register for the Karman filter process (step S43).

Next, the processor 50 determines whether or not a hold-over flag (a signal HOLDOVER in FIG. 17) is active (step S44). The hold-over flag becomes active in a case where the hold-over processor 52 determines a hold-over state.

In a case where the hold-over flag is inactive, the Karman filter 54 performs the Karman filter process on an input which is selected in step S42 or S43 (step S45). Next, the processor 50 determines whether or not the internal PLL mode is set (step S46). In a case where the internal PLL mode is set, the frequency control data QDF is stored in a register for a variable TReg (step S47). In a case where the external PLL mode is set, the frequency control data DFCE is stored in the register for the variable TReg (step S48).

Next, the processor 50 determines whether or not the temperature compensation process is set to be enabled (step S49). In a case where the temperature compensation process is set to be enabled, a value obtained by adding the variable TReg to the temperature compensation data TCODE is stored in a register for the frequency control data DFCQ' (step S50). In a case where the temperature compensation process is set to be disabled, the variable TReg is stored in the register for the frequency control data DFCQ' (step S51). The processes in steps S49 to S51 correspond to processes performed by the adders 84 and 85 and the selector 87.

In a case where the hold-over flag is active in step S44, the aging corrector 56 performs the aging correction process (step S52). Next, the processor 50 determines whether or not the temperature detection finish flag is active (step S53). In a case where the temperature detection finish flag is active, a value obtained by adding the frequency control data AC(k) to the temperature compensation data TCODE is stored in the register for the frequency control data DFCQ' (step S54). In a case where the temperature detection finish flag is inactive, the frequency control data AC(k) is stored in the register for the frequency control data DFCQ' (step S55). The processes in S53 to S55 correspond to processes performed by the adder 86 and the selector 87.

Figure 13:
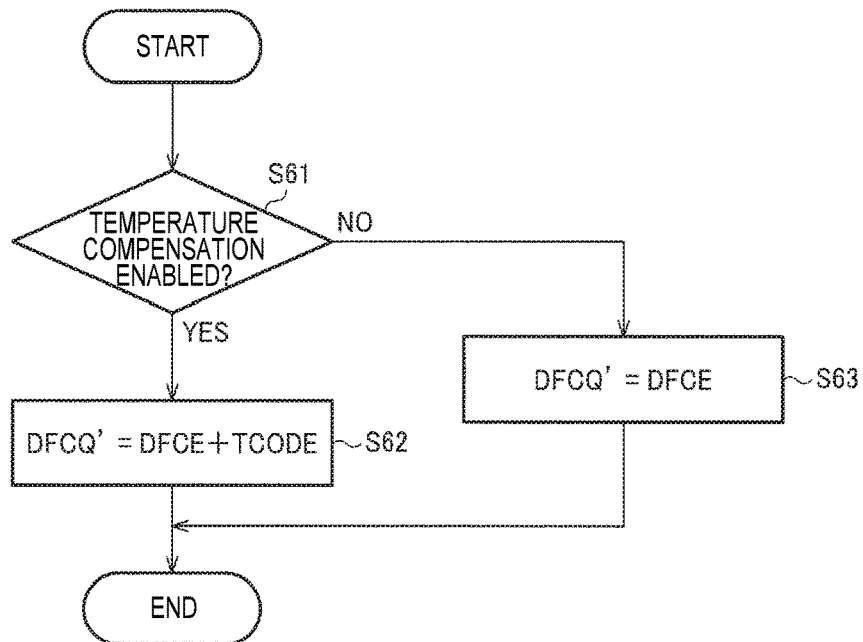
FIG. 13 is a flowchart illustrating details of a process in an external PLL mode.

FIG. 13 is a flowchart illustrating details of the process (step S6) in the external PLL mode.

The processor 50 determines whether or not the temperature compensation process is set to be enabled (step S61). In a case where the temperature compensation process is set to be enabled, a value obtained by adding the frequency control data DFCE to the temperature compensation data TCODE is stored in the register for the frequency control data DFCQ' (step S62). In a case where the temperature compensation process is set to be disabled, the frequency control data DFCE is stored in the register for the frequency control data DFCQ' (step S63). The processes in steps S61 to S63 correspond to processes performed by the adder 84 and the selector 87.

Figure 14:
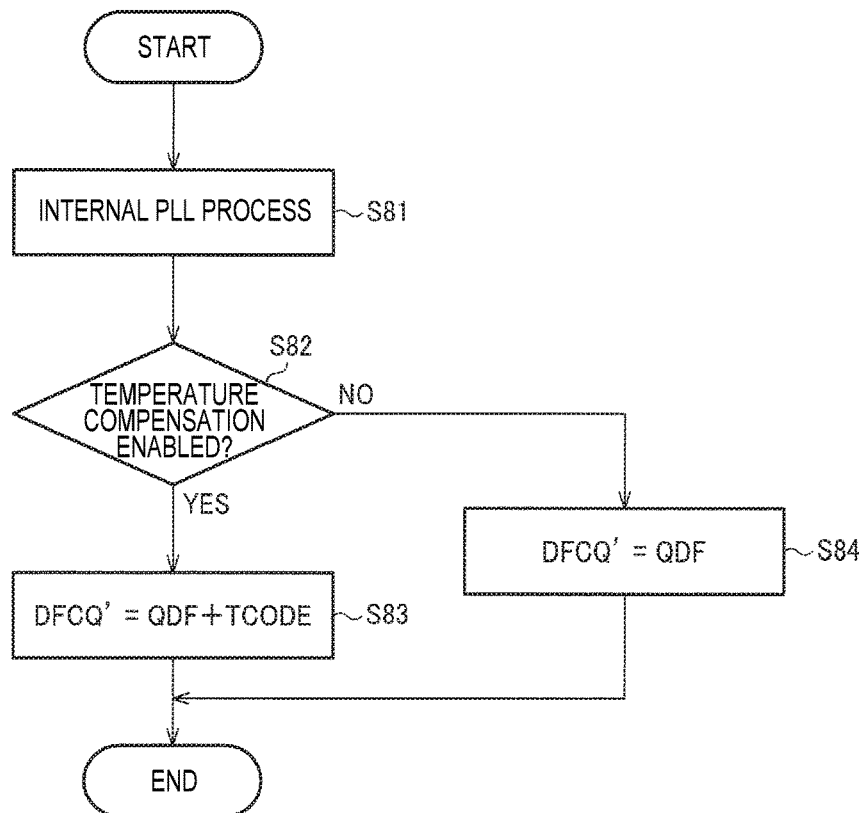
FIG. 14 is a flowchart illustrating details of a process in an internal PLL mode.

FIG. 14 is a flowchart illustrating details of the process (step S8) in the internal PLL mode.

The internal PLL processor 83 performs an internal PLL process on the phase error data PED so as to generate the frequency control data QDF (step S81). Next, the processor 50 determines whether or not the temperature compensation process is set to be enabled (step S82). In a case where the temperature compensation process is set to be enabled, a value obtained by adding the frequency control data QDF to the temperature compensation data TCODE is stored in the register for the frequency control data DFCQ' (step S83). In a case where the temperature compensation process is set to be disabled, the frequency control data QDF is stored in the register for the frequency control data DFCQ' (step S84). The processes in S82 to S84 correspond to processes performed by the adder 85 and the selector 87.

8. Third Detailed Configuration of Processor

Figure 15:
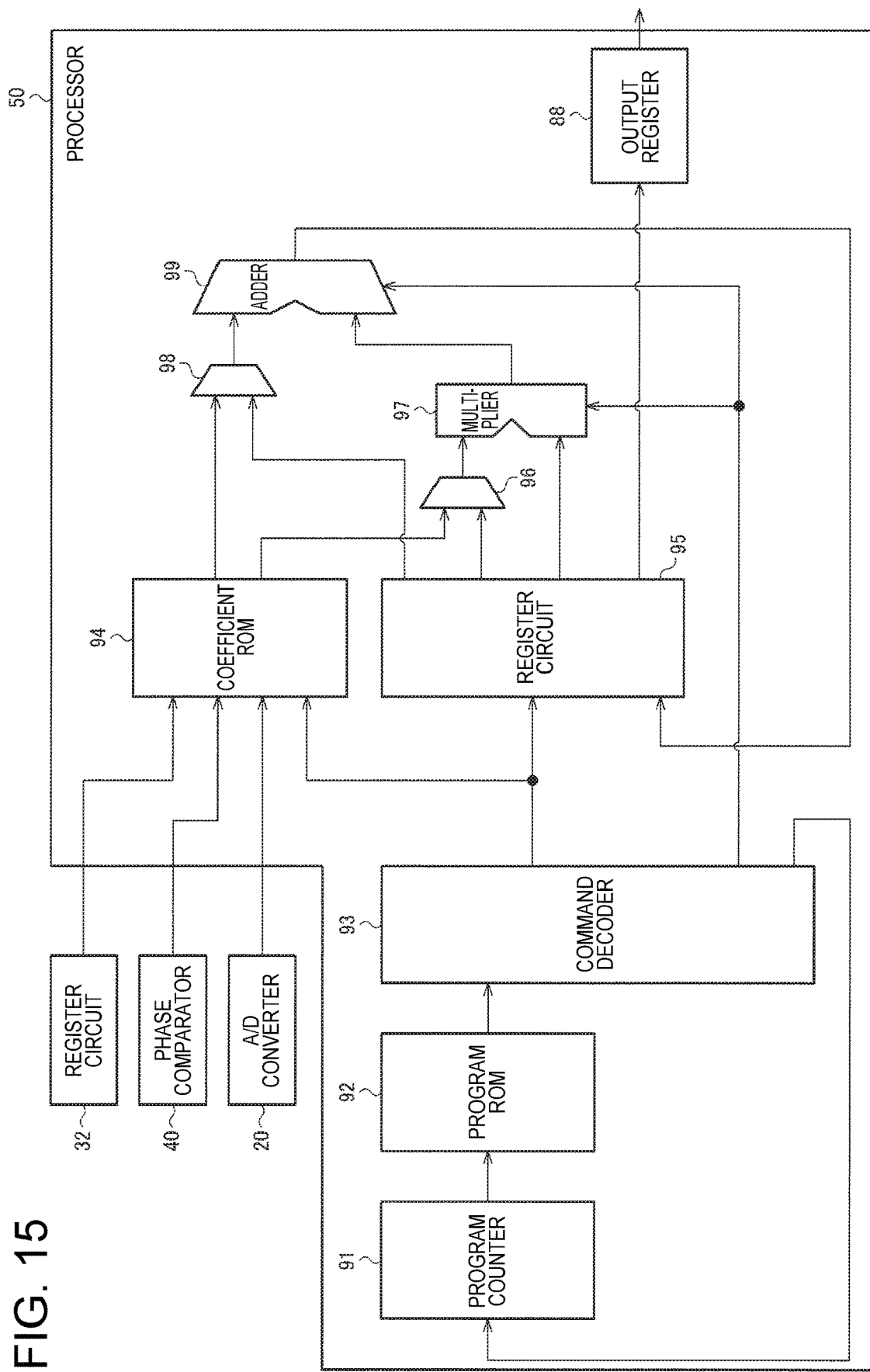
FIG. 15 is a diagram illustrating a third detailed configuration example of the processor.

FIG. 15 is a diagram illustrating a third detailed configuration example of the processor 50. FIG. 15 illustrates a configuration example of a case where the processor 50 is formed of a DSP. In other words, the DSP executes commands described in a program, and thus the process described with reference to the functional block diagram of FIG. 9 or the processes described with reference to the flowcharts of FIGS. 10 to 14 are realized.

The processor 50 includes a program counter 91, a program ROM 92, a command decoder 93, a coefficient ROM 94, a register circuit 95, a selector 96, a multiplier 97, a selector 98, an adder 99, and an output register 88.

The program ROM 92 is a read only memory (ROM) storing a program. Program data may be formed by using logic circuits (a combined circuit or the like). For example, the program is formed of a row number, a command corresponding to the row number, and an operand operated according to the command.

The program counter 91 is a counter which outputs a row number of the program. The program ROM 92 outputs a row number, a command, and an operand, designated by a count value in the program counter 91.

The command decoder 93 analyzes the command and the operand, and outputs control signals for the multiplier 97 or the adder 99 performing a process corresponding to the command and the operand. Specifically, the command decoder 93 outputs a multiplier input address for indicating data which is to be input to the multiplier 97, a multiplier input data sign indicating a sign of data which is to be input to the multiplier 97, an adder input address for indicating data which is to be input to the adder 99, an adder input data sign indicating a sign of data which is to be input to the adder 99, and a write address indicating a register address in which data output from the adder 99 is stored.

The coefficient ROM 94 includes a ROM and a selector. Various some coefficients used for calculation performed by the processor 50 are stored in the ROM. Remaining some coefficients are stored in the storage 34, and are read from the storage 34 so as to be stored in the register circuit 32. Coefficients from the ROM and the register circuit 32 and data which is input to the processor 50 are input to the selector. The input data includes, for example, the frequency control data DFCE from the register circuit 32, the phase error data PED from the phase comparator 40, and the temperature detection data DTD from the A/D converter 20. The selector selects a coefficient or input data corresponding to the multiplier input address from the command decoder 93, and outputs the selected coefficient or input data to the selector 96. The selector selects a coefficient or input data corresponding to the adder input address from the command decoder 93, and outputs the selected coefficient or input data to the selector 98.

The register circuit 95 includes a register and a selector. The register temporarily stores data (including intermediately generated data) generated through calculation. For example, the register stores the variable TReg, the temperature compensation data TCODE, and the frequency control data QDF, DFCQ' and AC(k). The selector selects data corresponding to the multiplier input address from the command decoder 93, and outputs the selected data to the selector 96 or the multiplier 97. The selector selects data corresponding to the adder input address from the command decoder 93, and outputs the selected data to the selector 98.

The selector 96 selects one of the coefficient or the input data from the coefficient ROM and the data from the register circuit 95, and outputs a selected result to the multiplier 97. The selector 98 selects one of the coefficient or the input data from the coefficient ROM and the data from the register circuit 95, and outputs a selected result to the adder 99.

The multiplier 97 multiplies an output from the selector 96 by the data from the register circuit 95, and outputs a result thereof to the adder 99. The adder 99 adds an output from the selector 98 to an output from the multiplier 97, and outputs a result thereof to the register circuit 95. The register circuit 95 stores the output from the multiplier 97 in a register of the register circuit 95 corresponding to the write address from the command decoder 93.

The output register 88 stores data output from the processor 50, and outputs the data to an external device of the processor 50. For example, the output register 88 stores the frequency control data DFCQ which is output to the oscillation signal generation circuit 140 (or the dithering processor 160).

9. Aging Correction Using Karman Filter Process

In the present embodiment, an aging correction method using a Karman filter process is employed. Hereinafter, this method will be described.

Figure 16:
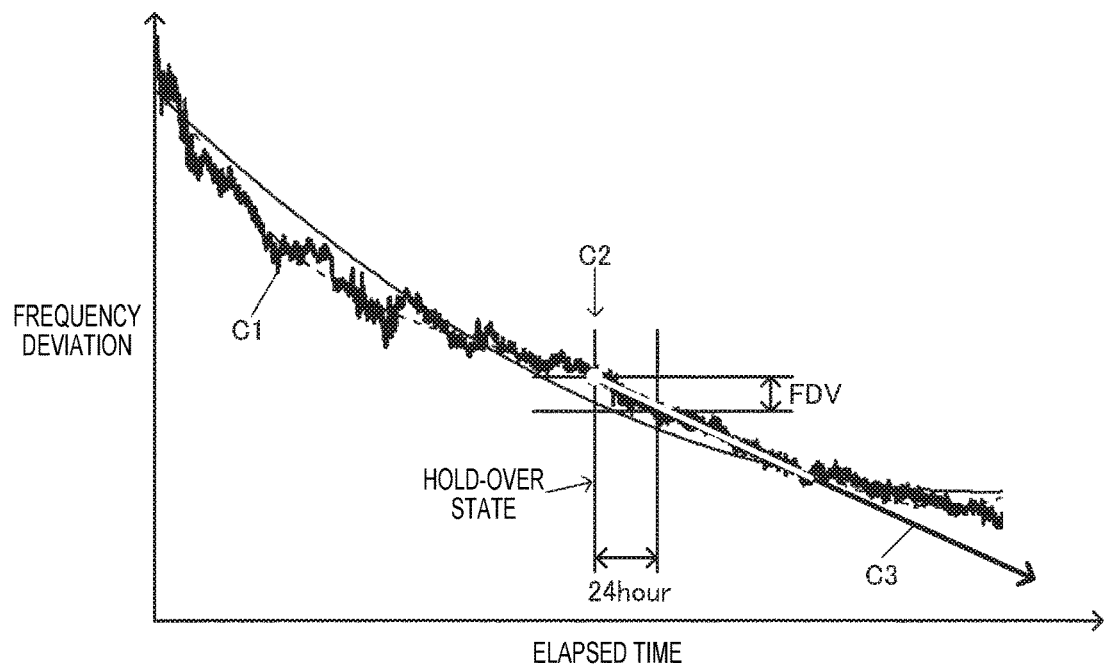
FIG. 16 is a diagram illustrating an example of a measurement result of a variation in an oscillation frequency due to aging.

FIG. 16 is a diagram illustrating results of measuring an oscillation frequency change due to aging. A transverse axis expresses the elapsed time (aging time), and a longitudinal axis expresses the frequency deviation ($\Delta f/f_0$) of an oscillation frequency. As indicated by C1 in FIG. 16, there are large variations caused by system noise or observation noise in measured values which are observed values. These variations also include a variation caused by the environmental temperature. In a situation in which there are large variations in the observed values, in the present embodiment, state estimation using a Karman filter process (for example, a linear Karman filter process) is performed in order to obtain an accurate true value.

Discrete time state equations of a time-series state space model are given by a state equation and an observation equation of the following (11) and (12).

$$x(k+1) = A \cdot x(k) + v(k) \quad (11)$$

$$y(k) = x(k) + w(k) \quad (12)$$

Here, x(k) indicates a state at a time point k, and y(k) indicates an observed value (frequency control data). In addition, v(k) indicates system noise, w(k) indicates observation noise, and A is a system matrix. In a case where x(k) indicates an oscillation frequency (frequency control data), A corresponds to, for example, an aging rate (aging coefficient). The aging rate indicates a change rate of the oscillation frequency with respect to the elapsed time.

For example, it is assumed that a hold-over state occurs at a timing indicated by C2 in FIG. 16. In this case, aging correction is performed on the basis of a true value x(k) at the time point C2 at which the reference signal RFCK is stopped, and an aging rate (A) corresponding to an inclination indicated by C3 in FIG. 16. Specifically, as compensation (correction) for reducing a frequency change at the aging rate indicated by C3, for example, aging correction of sequentially changing the true value x(k) of the oscillation frequency (frequency control data) at the time point C2 with a correction value for canceling the frequency change is performed.

Details of the Karman filter process in the present embodiment will be described. In the Karman filter process of the present embodiment, the process is performed according to the following Equations (13) to (18), and thus a true value is estimated. In the present specification, the hat symbol "^" indicating an estimated value is arranged with two letters as appropriate.

$$\hat{x}^-(k) = \hat{x}(k-1) + D(k-1) \quad (13)$$

$$P^-(k) = P(k-1) + v(k) \quad (14)$$

$$G(k) = \frac{P^-(k)}{P^-(k) + w(k)} \quad (15)$$

$$\hat{x}(k) = \hat{x}^-(k) + G(k) \cdot (y(k) - \hat{x}^-(k)) \quad (16)$$

$$P(k) = (1 - G(k)) \cdot P^-(k) \quad (17)$$

$$D(k) = D(k-1) + E \cdot (y(k) - \hat{x}^-(k)) \quad (18)$$

$\hat{x}(k)$: post-estimated value
$\hat{x}^-(k)$: pre-estimated value
P(k): post-covariance
P$^-$(k): pre-covariance
G(k): Karman gain In the Karman filter process, the Karman gain G(k) is obtained according to the above Equation (15) during observation update (observation process). The post-estimated value x^(k) is updated according to the above Equation (16) on the basis of the observed value y(k). The post-covariance P(k) of errors is updated according to the above Equation (17).

In time update (prediction process), as shown in the above Equation (13), the pre-estimated value x^-(k) at the next time step k is predicted by adding the post-estimated value x^(k-1) and the correction value D(k-1) at the time step k-1 together. As shown in the above Equation (14), the pre-covariance P$^-$(k) at the next time step k is predicted on the basis of the post-covariance P(k-1) at the time step k-1 and the system noise v(k). As shown in the above Equation (18), the correction value D(k) at the next time step k is obtained by adding the correction value D(k-1) at the time step k-1 to a value obtained by multiplying an observation residual y(k)-x^-(k) by a constant E. In the present embodiment, as shown in the above Equation (13), the post-estimated value x^(k-1) is added to the correction value D(k-1) instead of multiplying the post-estimated value x^(k-1) by the system matrix A. In other words, the correction value D(k) corresponds to a predicted value for an aging rate.

Figure 17:
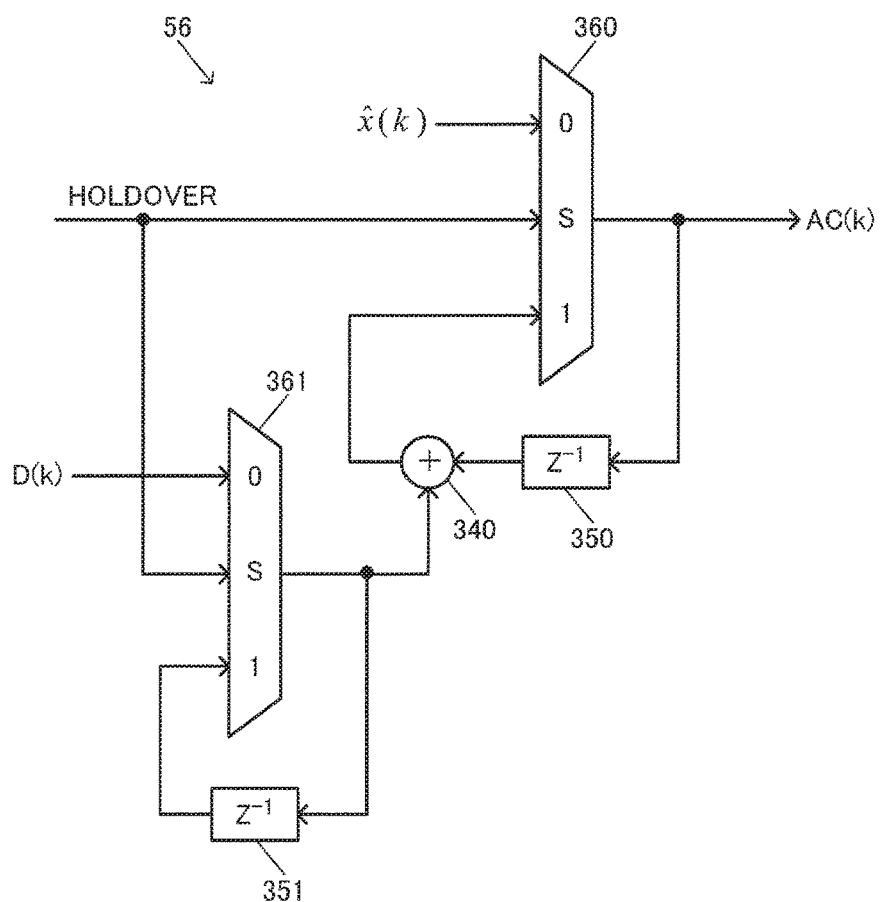
FIG. 17 is a diagram illustrating a detailed configuration example of an aging corrector.

FIG. 17 illustrates a detailed configuration example of the aging corrector 56.

The signal HOLDOVER is a signal whose logic level is "1" (active; hereinafter, simply referred to as "1") in a hold-over period in which a hold-over state is detected. Specifically, a signal PLOCK which is a lock detection signal in the external PLL mode or a signal DTL which is a lock detection signal in the internal PLL mode is set as a signal PLLLOCK. In a case where the signal PLLLOCK has a logic level of "0" (inactive; hereinafter, simply referred to as "0") and a signal SYNCCLK has "0", the signal HOLDOVER has "1", and, in a case where the signal PLLLOCK has "1" or the signal SYNCCLK has "1", the signal HOLDOVER has "0".

In a normal operation period, since the signal HOLDOVER has "0", selectors 360 and 361 select terminal "0" sides. Consequently, in the normal operation period, the post-estimated value x^(k) and the correction value D(k) calculated by the Karman filter 54 are respectively held in registers 350 and 351.

If a hold-over state is detected, and the signal HOLD-OVER has "1", the selectors 360 and 361 select terminal "1" sides. Consequently, the selector 361 continuously outputs the correction value D(k) held in the register 351 at the hold-over detection timing during a hold-over period.

An adder 340 performs a process of sequentially adding the correction value D(k) (correction value) which is held in the register 351 and is output from the selector 361, to the post-estimated value x^(k) held in the register 350 at the hold-over detection timing, for each time step. Consequently, aging correction as expressed by the following Equation (19) is realized.

$$AC(k+1)=AC(k)+D(k) \quad (19)$$

10. Oscillation Circuit

Figure 18:
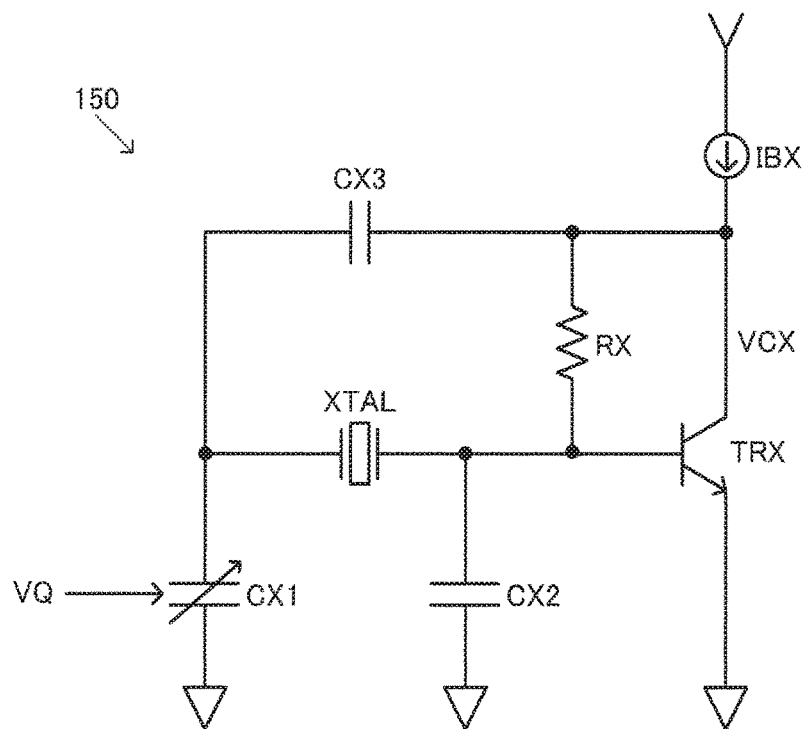
FIG. 18 is a diagram illustrating a configuration example of an oscillation circuit.

FIG. 18 illustrates a configuration example of the oscillation circuit 150. The oscillation circuit 150 includes a current source IBX, a bipolar transistor TRX, a resistor RX, a variable capacitance capacitor CX1, and capacitors CX2 and CX3.

The current source IBX supplies a bias current to a collector of the bipolar transistor TRX. The resistor RX is provided between the collector and a base of the bipolar transistor TRX.

One end of the variable capacitance capacitor CX1 whose capacitance is variable is connected to a resonator XTAL. Specifically, one end of the variable capacitance capacitor CX1 is connected to one end of the resonator XTAL via a first resonator terminal (resonator pad) of the circuit device 500. One end of the capacitor CX2 is connected to the other end of the resonator XTAL. Specifically, one end of the capacitor CX2 is connected to the other end of the resonator XTAL via a second resonator terminal (resonator pad) of the circuit device 500. One end of the capacitor CX3 is connected to one end of the resonator XTAL, and the other end thereof is connected to the collector of the bipolar transistor TRX.

A base-emitter current caused by oscillation of the resonator XTAL flows through the bipolar transistor TRX. If the base-emitter current increases, a current between the collector and the emitter of the bipolar transistor TRX increases, and thus a bias current which branches to the resistor RX from the current source IBX is reduced so that a collector voltage VCX is lowered. On the other hand, if a current between the base and the emitter of the bipolar transistor TRX is reduced, a collector-emitter current is reduced, and thus a bias current which branches to the resistor RX from the current source IBX increases so that the collector voltage VCX is heightened. The collector voltage VCX is fed back to the resonator XTAL via the capacitor CX3.

An oscillation frequency of the resonator XTAL has temperature characteristics, and the temperature characteristics are compensated by the output voltage VQ (frequency control voltage) from the D/A converter 80. In other words, the output voltage VQ is input to the variable capacitance capacitor CX1, and thus a capacitance value of the variable capacitance capacitor CX1 is controlled by the output voltage VQ. If the capacitance value of the variable capacitance capacitor CX1 changes, a resonance frequency of an oscillation loop changes, and thus a variation in an oscillation frequency due to the temperature characteristics of the resonator XTAL is compensated for. The variable capacitance capacitor CX1 is implemented by, for example, a variable capacitance diode (varactor).

11. Modification Examples

Figure 19:
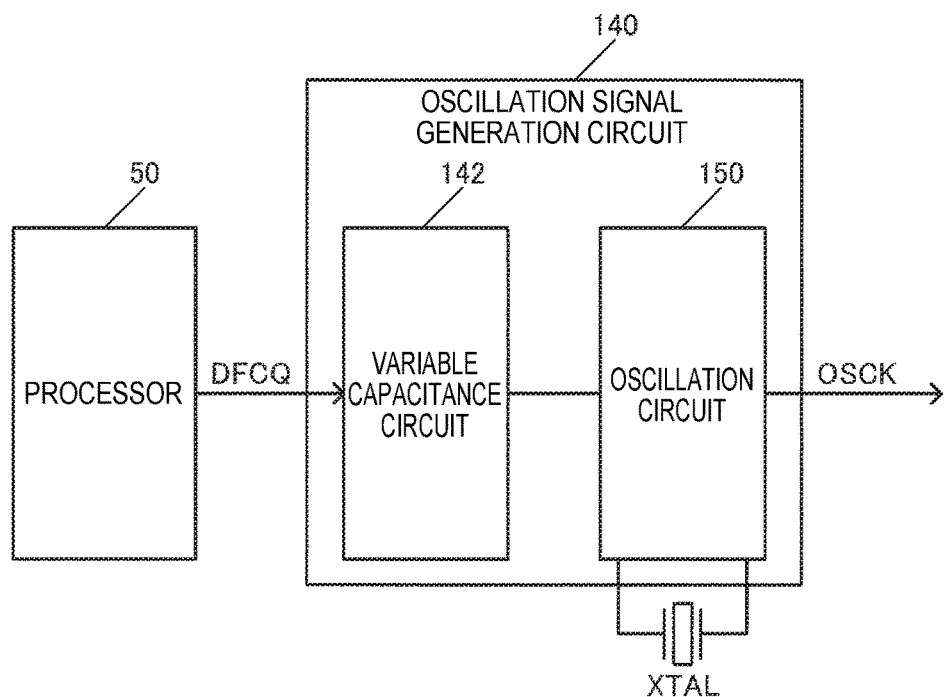
FIG. 19 is a diagram illustrating a configuration example of a circuit device according to a modification example of the embodiment.

Next, various modification examples of the present embodiment will be described. FIG. 19 illustrates a configuration example of a circuit device according to a modification example of the present embodiment.

In FIG. 19, the D/A converter 80 is not provided in the oscillation signal generation circuit 140 unlike in FIG. 8. An oscillation frequency of the oscillation signal OSCK generated by the oscillation signal generation circuit 140 is directly controlled on the basis of the frequency control data DFCQ from the processor 50. In other words, an oscillation frequency of the oscillation signal OSCK is controlled without using the D/A converter.

For example, in FIG. 19, the oscillation signal generation circuit 140 has a variable capacitance circuit 142 and an oscillation circuit 150. The variable capacitance circuit 142 is provided instead of the variable capacitance capacitor CX1 illustrated in FIG. 18, and one end of the variable capacitance circuit 142 is connected to one end of the resonator XTAL.

A capacitance value of the variable capacitance circuit 142 is controlled on the basis of the frequency control data DFCQ from the processor 50. For example, the variable capacitance circuit 142 is provided with a plurality of capacitors (capacitor array), and a plurality of switch elements (switch array) each of which allows turning-on and turning-off to be controlled on the basis of the frequency control data DFCQ. Each of the plurality of switch elements is electrically connected to each of the plurality of capacitors. The plurality of switch elements are turned on or off, and thus the number of capacitors whose one ends are connected to one end of the resonator XTAL among the plurality of capacitors changes. Consequently, a capacitance value of the variable capacitance circuit 142 is controlled, and thus a capacitance value of the resonator XTAL changes. Therefore, a capacitance value of the variable capacitance circuit 142 can be directly controlled by the frequency control data DFCQ, and thus an oscillation frequency of the oscillation signal OSCK can be controlled.

Figure 20:
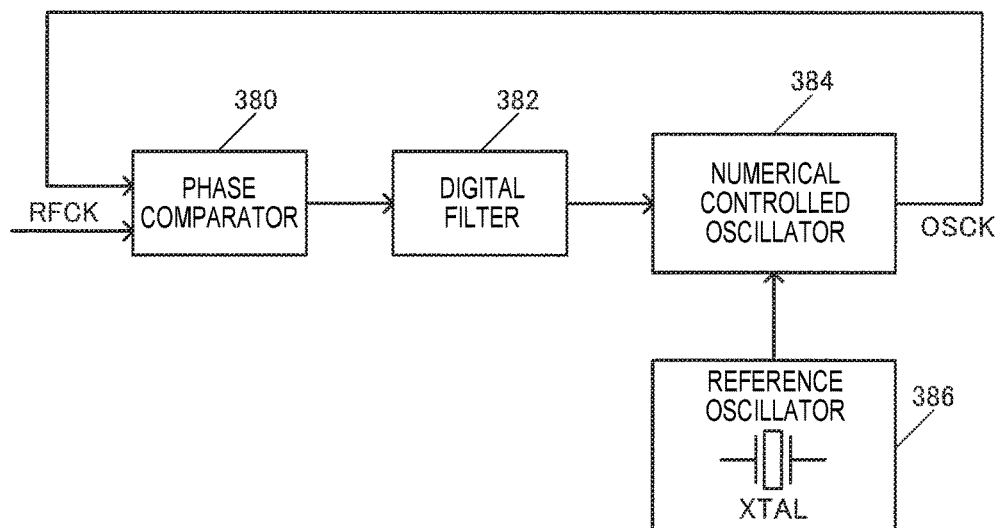
FIG. 20 illustrates a circuit configuration example in a case of a direct digital synthesizer method.

In a case where a PLL circuit is formed by using the circuit device of the present embodiment, the PLL circuit may be formed according to a direct digital synthesizer method. FIG. 20 illustrates a circuit configuration example in a case of the direct digital synthesizer method.

A phase comparator 380 (comparison calculator) performs comparison calculation between the reference signal RFCK and the oscillation signal OSCK (an input signal based on the oscillation signal). A digital filter 382 performs a smoothing process on phase errors. A configuration and an operation of the phase comparator 380 are the same as those of the phase comparator 40 illustrated in FIG. 1, and may include the counter 42 or the like. The digital filter 382 corresponds to the phase error converter 51, the loop filter 55, and the frequency control data converter 57 illustrated in FIG. 4. A numerical controlled oscillator 384 is a circuit which digitally synthesizes any frequency or waveform by using a reference oscillation signal from a reference oscillator 386 having the resonator XTAL. In other words, instead of controlling an oscillation frequency on the basis of a control voltage from a D/A converter, such as a VCO, the oscillation signal OSCK having any oscillation frequency is generated through a digital calculation process by using digital frequency control data and the reference oscillator 386 (resonator XTAL).

12. Oscillator, Electronic Apparatus, and Vehicle

Figure 21:
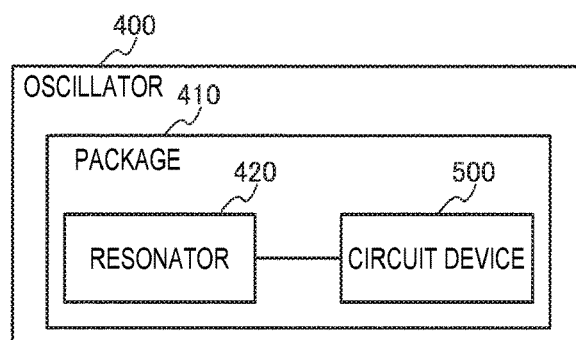
FIG. 21 is a diagram illustrating a configuration example of an oscillator including the circuit device according to the embodiment.

FIG. 21 illustrates a configuration example of an oscillator 400 provided with the circuit device 500 of the present embodiment. As illustrated in FIG. 21, the oscillator 400 includes a resonator 420 and the circuit device 500. The resonator 420 and the circuit device 500 are mounted in a package 410 of the oscillator 400. A terminal of the resonator 420 is electrically connected to a terminal (pad) of the circuit device 500 (integrated circuit device; IC) via an internal wiring of the package 410.

Figure 22:
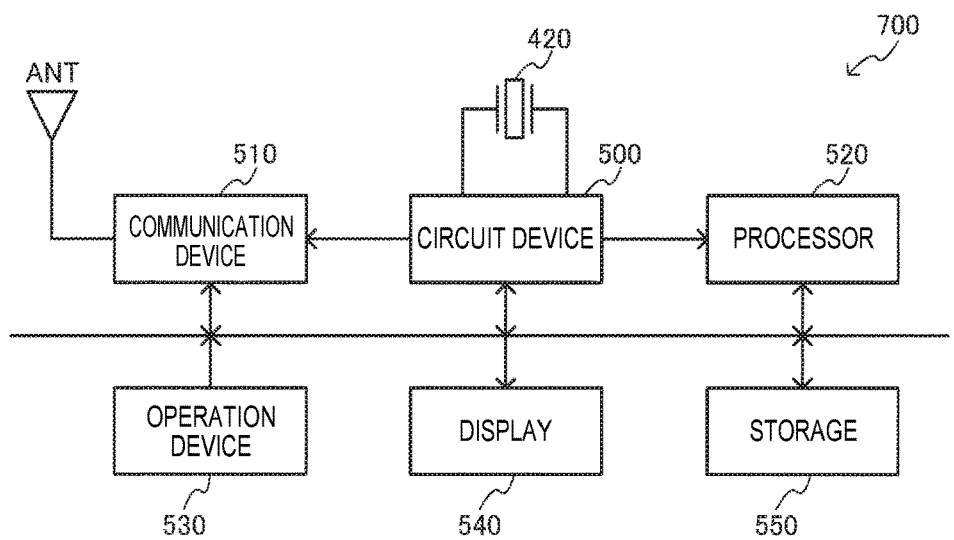
FIG. 22 is a diagram illustrating a configuration example of an electronic apparatus including the circuit device according to the embodiment.

FIG. 22 illustrates a configuration example of an electronic apparatus 700 including the circuit device 500 of the present embodiment. The electronic apparatus 700 includes the circuit device 500 of the present embodiment, the resonator 420 such as a quartz crystal resonator, an antenna ANT, a communication device 510, a processor 520, and the like. The electronic apparatus 700 may include an operation device 530, a display 540, and a storage 550. The oscillator 400 is formed of the resonator 420 and the circuit device 500. A configuration of the electronic apparatus is not limited to the configuration illustrated in FIG. 22, and may be variously modified by omitting some constituent elements or adding other constituent elements thereto.

As the electronic apparatus 700 illustrated in FIG. 22, there may be various apparatuses, for example, a network related apparatus such as a base station or a router, a highly accurate measurement apparatus, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, and a video apparatus such as a digital camera or a video camera.

The communication device 510 (wireless circuit) performs a process of receiving data from an external apparatus or transmitting data to the external apparatus, via the antenna ANT. The processor 520 performs a process of controlling the electronic apparatus 700, or various digital processes on data which is transmitted and received via the communication device 510. The function of the processor 520 may be realized by, for example, a processor such as a microcomputer.

The operation device 530 is used for a user to perform an input operation, and may be implemented by, for example, an operation button or a touch panel display. The display 540 displays various pieces of information, and may be implemented by, for example, a liquid crystal display or an organic EL display. In a case where a touch panel display is used as the operation device 530, the touch panel display also functions as the operation device 530 and the display 540. The storage 550 stores data, and a function thereof may be realized by a semiconductor memory such as a RAM or a ROM, or a hard disk drive (HDD).

Figure 23:
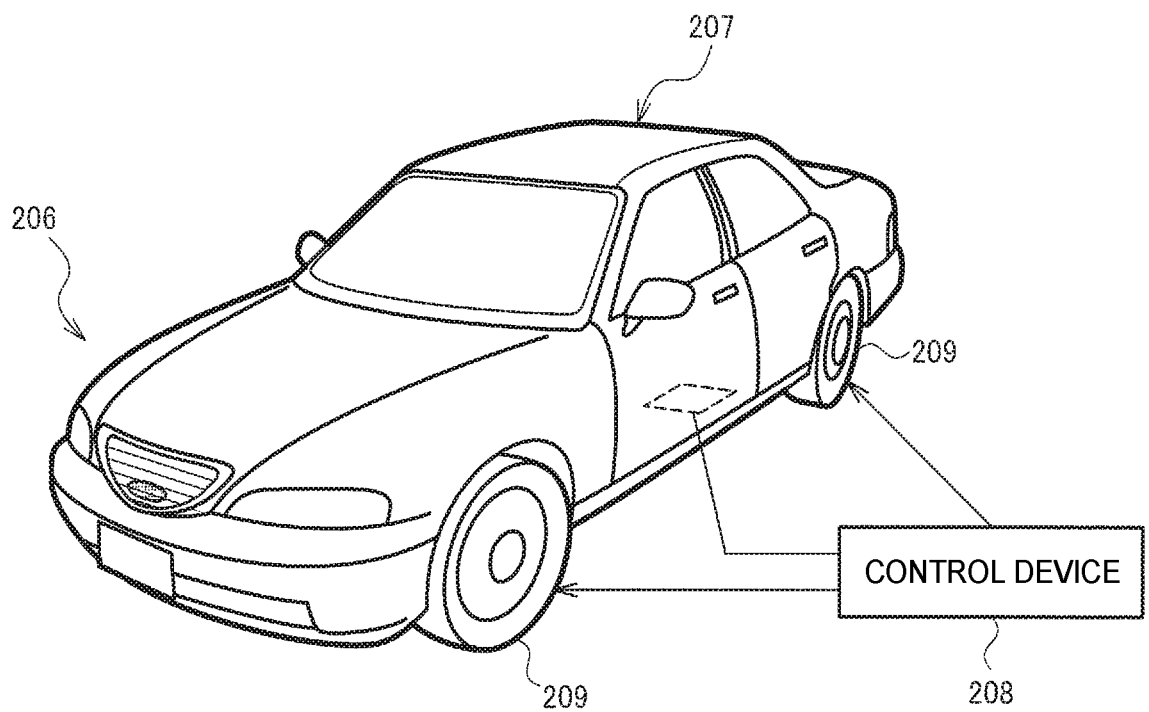
FIG. 23 is a diagram illustrating an example of a vehicle including the circuit device according to the embodiment.

FIG. 23 illustrates an example of a vehicle including the circuit device 500 of the present embodiment. The circuit device 500 (the oscillator 400 including the circuit device 500) of the present embodiment may be incorporated into, for example, various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 23 schematically illustrates an automobile 206 as a specific example of the vehicle. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a vehicle such as the automobile 206.

Figure 24:
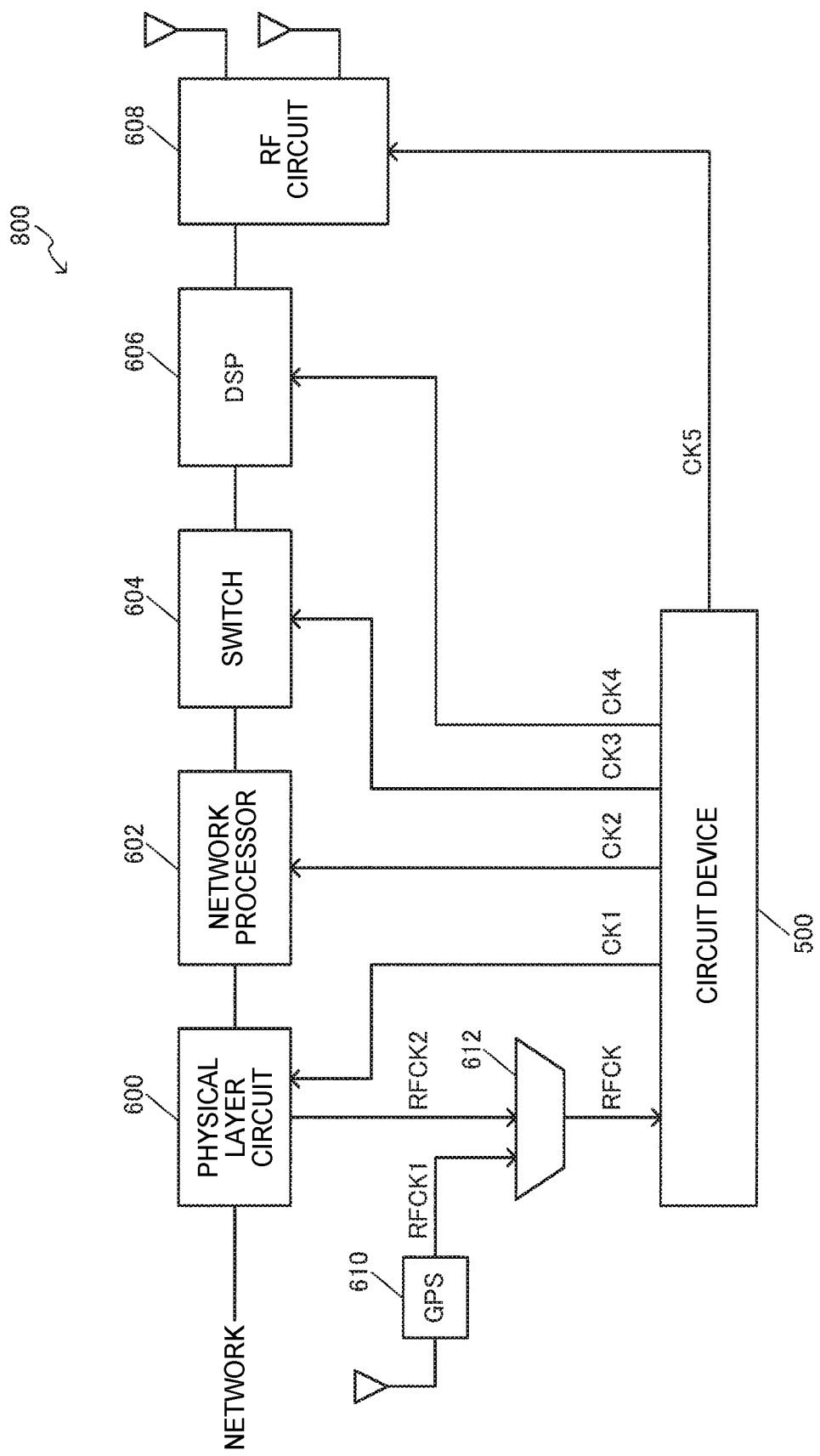
FIG. 24 is a diagram illustrating a configuration example of a base station which is one of the electronic apparatuses.

FIG. 24 illustrates a configuration example of a base station 800 (base station apparatus) which is one of the electronic apparatuses. A physical layer circuit 600 performs a process on a physical layer in a communication process using a network. A network processor 602 performs a process on a higher-order layer (a link layer or the like) than the physical layer. A switch 604 performs various switching processes in the communication process. A DSP 606 performs various digital signal processes which are necessary in the communication process. An RF circuit 608 includes a reception circuit formed of a low noise amplifier (LNA), a transmission circuit formed of a power amplifier, a D/A converter, an A/D converter, and the like.

A selector 612 outputs either a reference signal RFCK1 from a GPS 610 or a reference signal RFCK2 (a clock signal from the network) from the physical layer circuit 600, to the circuit device 500 of the present embodiment as the reference signal RFCK. The circuit device 500 performs a process of synchronizing an oscillation signal (an input signal based on the oscillation signal) with the reference signal RFCK. Various clock signals CK1, CK2, CK3, CK4 and CK5 having different frequencies are generated, and are supplied to the physical layer circuit 600, the network processor 602, the switch 604, and the DSP 606, and the RF circuit 608.

According to the circuit device 500 of the present embodiment, in a base station as illustrated in FIG. 24, an oscillation signal can be synchronized with the reference signal RFCK, and the clock signals CK1 to CK5 having the high frequency stability, generated on the basis of the oscillation signal, can be supplied to the respective circuits of the base station.

Although the present embodiment has been described as above in detail, it can be easily understood by a person skilled in the art that various modifications without substantially departing from the new matters and effects of the various embodiments of the invention are possible. Therefore, these modifications are all included in the scope of the various embodiments of the invention. For example, in the specification or the drawings, the terminologies which are mentioned at least once along with different terminologies which have broader meanings or the same meanings may be replaced with the different terminologies in any location of the specification or the drawings. All combinations of the present embodiment and the modification examples are included in the scope of the present disclosure and appended claims. In addition, configurations, operations, and the like of the phase comparator, the processor, the oscillation signal generation circuit, the circuit device, the oscillator, the

What is claimed is:

1. A circuit device comprising:
   a phase comparator configured to perform phase comparison between an input signal based on an oscillation signal and a reference signal;
   a processor configured to output frequency control data based on phase comparison result data which is obtained through the phase comparison;
   an oscillation signal generation circuit configured to generate the oscillation signal having an oscillation frequency which is set on the basis of the frequency control data from the processor; and
   first, second and third registers,
   wherein the first register is configured to store the phase comparison result data,
   wherein first offset adjustment data which is used for offset adjustment on the phase comparison result data and is one of offset adjustment data for global positioning system (GPS) and offset adjustment data for Coordinated Universal Time (UTC) is set in the second register, and
   wherein second offset adjustment data which is used for the offset adjustment and is used to adjust a phase difference between the reference signal and the oscillation signal is set in the third register.

2. The circuit device according to claim 1, further comprising:
   a terminal that is connectable to a resonator used to generate the oscillation signal,
   wherein the oscillation signal is a signal output from the terminal.

3. The circuit device according to claim 1,
   wherein, in a test mode, test data for simulating the phase comparison result data is input as offset adjustment data.

4. The circuit device according to claim 1,
   wherein the processor is configured to perform the offset adjustment on the basis of at least one of the first offset adjustment data and the second offset adjustment data, and configured to generate the frequency control data on the basis of the phase comparison result data having undergone the offset adjustment.

5. The circuit device according to claim 1,
   wherein the offset adjustment data for GPS is different from the offset adjustment data for UTC.

6. The circuit device according to claim 5,
   wherein the offset adjustment data for GPS is offset adjustment data for adjusting a phase difference between the reference signal and the input signal to a predetermined value for GPS.

7. The circuit device according to claim 5,
   wherein the offset adjustment data for UTC is offset adjustment data for adjusting a phase difference between the reference signal and the input signal to a predetermined value for UTC.

8. The circuit device according to claim 1,
   wherein the phase comparator includes a counter that performs a count operation by using the input signal, and performs the phase comparison by comparing a count value in the counter in n (where n is an integer of 1 or more) cycles of the reference signal with an expected value of the count value in integers.

9. The circuit device according to claim 1,
   wherein the processor is configured to perform the signal process including at least one of a temperature compensation process, an aging correction process, and a process of correcting capacitance characteristics of a variable capacitance capacitor connected to a resonator used to generate the oscillation signal, and the offset adjustment.

10. The circuit device according to claim 9,
    wherein the phase comparison result data is phase error data, and
    wherein the processor is configured to perform a digital filter process on the phase error data.

11. The circuit device according to claim 1, further comprising:
    a digital interface,
    wherein the oscillation signal generation circuit is configured to:
       generate the oscillation signal by using frequency control data based on the phase comparison result data in a first mode, and
       generate the oscillation signal by using frequency control data based on externally generated frequency control data which is input via the digital interface in a second mode.

12. An oscillator comprising:
    the circuit device according to claim 1; and
    a resonator that is used to generate the oscillation signal.

13. An electronic apparatus comprising the circuit device according to claim 1.

14. A vehicle comprising the circuit device according to claim 1.

15. A data storage and retrieval system for a computer memory, the data storage and retrieval system having a register circuit configuring the computer memory, the register circuit comprising:
    a monitor register configured to store phase comparison result data;
    an offset register configured to store offset adjustment data, the offset adjustment data including one of global positioning system (GPS) offset adjustment data or Coordinated Universal Time (UTC) offset adjustment data, the offset adjustment data to be added to the phase comparison result data;
    a phase adjustment register configured to store the offset adjustment data for adjusting a phase difference between a reference signal and an oscillation signal; and
    a test input register configured to store test data for simulating phase comparison result data.

16. The data storage and retrieval system according to claim 15, further comprising a processor that performs a signal process on the test data stored in the test input register instead of in the phase comparison result data.

17. The data storage and retrieval system according to claim 15, wherein the phase comparison result data comprises phase error data.

18. The data storage and retrieval system according to claim 15, wherein the phase adjustment registers stores the test data during a test mode.

19. The data storage and retrieval system according to claim 15, further comprising an output connected to a terminal of a circuit device.

20. The data storage and retrieval system according to claim 15, wherein the register circuit further comprises an integer value register for storing an integer value defining a count operation performed using an input signal based on the oscillation signal, wherein the integer value is used to perform a phase comparison process.

21. The data storage and retrieval system according to claim 15, further comprising a processor coupled to register device, the processor configured to perform one of a temperature compensation process, an aging correction process, or a capacitance characteristic correction process in a time division manner, along with the offset adjustment.

22. An electronic apparatus comprising the data storage and retrieval system according to claim 15.

23. A vehicle comprising the data storage and retrieval system according to claim 15.

* * * * *